(12) United States Patent
Hiromi

(10) Patent No.: US 6,392,252 B2
(45) Date of Patent: May 21, 2002

(54) SEMICONDUCTOR DEVICE

(75) Inventor: Mitsuhisa Hiromi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/840,586

(22) Filed: Apr. 23, 2001

(30) Foreign Application Priority Data

Apr. 25, 2000 (JP) ........................................ 2000-124425

(51) Int. Cl.[7] .............................................. H01L 23/58
(52) U.S. Cl. ........................ 257/48; 257/211; 257/212; 257/758
(58) Field of Search ............................ 257/48, 49, 211, 257/208, 212, 758, 213; 438/462, 401, 618, 106

(56) References Cited

U.S. PATENT DOCUMENTS 6,285,045 B1 * 9/2001 Itabashi et al. ............. 257/211

FOREIGN PATENT DOCUMENTS

JP          5-3237          1/1993   ........... H01L/21/66

* cited by examiner

*Primary Examiner*—Chandra Chaudhari
*Assistant Examiner*—Yennhu B. Huynh
(74) *Attorney, Agent, or Firm*—Hayes, Soloway P.C.

(57) ABSTRACT

To provide a semiconductor device in which a direction of a conformation difference in respective wiring layers of semiconductor integrated circuits can be detected and at the same time a conformation difference detection sensitivity is increased. A semiconductor device is provided with semiconductor integrated circuits 10, which are practical circuits, and conformation difference detection circuits 11 in one and same semiconductor substrate. Each of the conformation difference detecting circuit 11 is provided with a plurality of lower layer wirings 31, a plurality of upper layer wirings 34 layered on the lower layer wirings 31 through insulating layers 32, and through holes 33 separately and successively contacting upper layer wirings 34 and the lower layer wirings 31 in constant directions and the conformation margin widths surrounding the contact faces of the through holes 33 are so set as to make widths d1, d3 positioned in prescribed one direction be narrower than widths d2, d4 positioned in the other direction.

10 Claims, 15 Drawing Sheets

FIG.11

| | difference degree of the lower layer wiring 31 and the through hole 33 | | difference degree of the lower layer wiring 31 and the through hole 33 |
|---|---|---|---|
| 43a | (plot with d9 below x-axis, on -x side near origin) | 42a | (plot with d9 on +x side) |
| 43b | (plot with d8 on -x side) | 42b | (plot with d8 on +x side) |
| 43c | (plot at origin) | 42c | (plot at origin) |
| 43ad | (plot with d8 near +y axis) | 42ad | (plot with d8 on +x side, below x-axis) |
| 43e | (plot with d9 on +y axis, -x side) | 42e | (plot with d9 on +x side, +y) |

$$\begin{pmatrix} d8, d9 : \text{difference degree of the lower layer} \\ \text{wiring 31 and the through hole 33} \end{pmatrix}$$

SEMICONDUCTOR DEVICE

BACKGROUND OF THE INVENTION

1. Field of the Invention

The present invention relates to a semiconductor device, more particularly to a semiconductor device equipped with conformation difference detection circuits for detecting a layering difference of semiconductor integrated circuits.

2. Description of the Prior Art

In general, in a semiconductor device comprising semiconductor integrated circuits, the conformation difference of the semiconductor integrated circuits is always inspected for product inspection of the semiconductor device.

At the time of conformation difference inspection, for example, a vernier pattern previously formed on a substrate of a semiconductor device is used.

At the time of conformation difference inspection by the vernier pattern, an operator inspects the conformation difference using an optical microscope or the like.

Further, Japanese Patent Laid-Open No. 5-3237 discloses a method using detection patterns composed of a lower layer pattern and an upper layer pattern mutually crossing each other and both formed in a void region of a semiconductor device as a technique of inspecting the conformation difference of respective wiring layers. This technique carries out conformation difference inspection of a semiconductor device by measuring the electric resistance at a prescribed point of the lower layer pattern, a detection pattern and calculating the conformation difference based on the measured value.

Further, one example of general detection patterns used conventionally is illustrated in FIG. 15.

In the conventional example illustrate in FIG. 15, the detection pattern is provided with conformation margin widths D51, D54 respectively in the X-direction and Y-direction surrounding the contact faces of a plurality of through holes 53 in the respective upper and lower layer wirings 51, 54 sides of the contacting faces of the through holes 53 and the respective upper and lower layer wirings 51, 54. In this case, the foregoing conformation margin width D51 shows the conformation margin width in the foregoing lower layer wiring 31 side and the foregoing conformation margin width D54 shows the conformation margin width in the foregoing upper layer wiring 54 side, respectively. Further, the foregoing respective conformation margin widths D51, D54 show the same widths, respectively, in the X-direction and the Y-direction. Incidentally, in FIG. 15, the reference character X denotes the X-direction; the reference character Y denotes the Y-direction; the reference numeral 50 denotes a circuit substrate; and the reference numeral 52 denotes an insulating layer.

In this case, for example, if conformation difference takes place in lower layer wirings 51 and through holes 53 and the electric resistance of each through hole 53 increases by b(delta), the electric resistance increase in the entire detection pattern is the product of δ×N wherein the reference character N denotes the total number of the through holes. Based on the electric resistance increase δ×N, whether the conformation difference is within an allowable range or not is determined. In the case, the reference character N denotes a natural number.

In such a manner, since the increase of the electric resistance of each through hole 53 is generally slight, about several ohm, the abnormality of through holes is detected by measuring the electric resistance of the entire detection pattern.

BRIEF SUMMARY OF THE INVENTION

Object of the Invention

However, although the conventional example using the above described vernier pattern is capable of detecting the conformation difference, there occur problems that, for example, disconnection or the like of the lower layer wirings, caused by a photolithographic technique or an etching technique relevant to semiconductor device fabrication cannot be detected and that the inspection precision of the fine technique is limited owing to the optical inspection by an optical microscope.

Further, in the technique disclosed in Japanese Patent Laid-Open No. 5-3237 and employing the detection pattern, although the technique can detect the disconnection of the lower layer wirings, there occurs a problem that the formation abnormality of through holes caused by photolithographic technique or the like cannot precisely be detected since the pattern cannot have the structure to measure the electric resistance in the inside of a through hole in the detection pattern.

Moreover, in the conventional example using the detection pattern illustrated in FIG. 15, although the conformation difference of a semiconductor device can be inspected, the conformation margin widths D51, D54 in the detection pattern are set to be mutually equal in the X-direction and the Y-direction. For that, if there occurs conformation difference, gaps are formed in the contact faces of the through holes 53 owing to the excess of the conformation difference widths D51, D54 independently of the X-direction and the Y-direction to result in increase of the electric resistance in the entire detection pattern. Consequently, a problem takes place that the direction of the conformation difference cannot be detected.

The present invention is to solve such problems of a conventional example and more particularly to provide a semiconductor device in which it is made possible to detect the direction of conformation difference of respective wiring layers of semiconductor integrated circuits and to increase the detection sensitivity.

Summary of the Invention

In order to attain the above described purposes, the respective inventions as set forth in claim 1 to claim 5 propose a semiconductor device having a common basic structure comprising: one or more of semiconductor integrated circuits formed on a semiconductor substrate; and conformation difference detection circuits formed on the same semiconductor substrate; to detect the layering difference of the semiconductor integrated circuits, wherein the conformation difference detection circuits are so composed of a plurality of lower layer wirings formed on the semiconductor substrate, a plurality of upper layer wirings layered on the lower layer wirings through insulating layers, through holes successively and respectively contacting the respective upper layer wirings and the lower layer wirings in prescribed directions, and electrode terminal faces set in both end parts of the circuits composed of the lower layer wirings and the upper layer wirings contacted through the through holes as to keep conformation margins with prescribed widths surrounding the contact faces of the through holes in the respective wiring sides in the contacting faces of the through holes and the respective wirings; and the widths of the conformation margins are so adjusted as to be narrower in one prescribed direction than the direction other than the prescribed direction.

For that, in the present invention as set forth in claim 1 to claim 5, gaps are made easy to be formed in the through hole contact faces in the one direction and as compared with a case where conformation difference in a prescribed extent is caused in the other direction, in the case where conformation difference in a prescribed extent is caused in the one direction, it is easy to exceed the conformation margin width. Consequently, even if a slight conformation difference takes place in the one direction, the conformation margin width is exceeded and, therefore, gaps are formed in the through hole contact faces in the one direction and the electric resistance of a conformation difference detection circuit increases and exceeds an allowable range. As a result, the detection sensitivity of conformation difference caused in a specified direction can be improved.

In this case, the prescribed circuits composed of the lower layer wirings and the upper layer wirings contacted through a plurality of through holes may be formed to be contacted circuits by continuously extending the circuits as a whole in one prescribed direction in a prescribed length.

Doing so, the electric resistance in conformation difference detection circuits is further increased corresponding to the extent of the contacted circuits even if slight conformation difference takes place in the one prescribed direction.

Further, regarding the foregoing contacted circuits, at least two rows of the circuits are formed and the respective contacted circuits may be connected in series.

Doing so, the electric resistance in conformation difference detection circuits is considerably increased corresponding to the increase of the contacted circuits connected in series even if slight conformation difference takes place in the one prescribed direction.

Further, the foregoing contacted circuits of the lower layer wirings and the upper layer wirings are made to be continued patterns in rectangular wavy form in one direction observed in a plane and at the same time the foregoing through holes are formed in the respective bending parts of the rectangular wavy continued patterns.

Doing so, even if slight conformation difference takes place in one direction, the electric resistance of the continued patterns is reliably increased and exceeds the allowable range.

Further, the foregoing one prescribed direction may be set to be X-direction and the other direction to be Y-direction.

Doing so, if a slight conformation difference takes place in X-direction at right angles to the Y-direction, the electric resistance of the conformation difference detection circuits is increased.

The respective inventions as set forth in claim 6 to claim 8 propose a semiconductor device having a common basic structure comprising one or more of semiconductor integrated circuits formed on a semiconductor substrate and conformation difference detection circuits formed on the same semiconductor substrate to detect the layering difference of the semiconductor integrated circuits:

wherein the conformation difference detection circuits are so composed of a plurality of lower layer wirings formed on the semiconductor substrate, a plurality of upper layer wirings layered on the lower layer wirings through insulating layers, through holes successively and respectively contacting the respective upper layer wirings and the lower layer wirings in prescribed directions, and electrode terminal faces set in both end parts of the circuits composed of the lower layer wirings and the upper layer wirings contacted through the through holes as to keep conformation margins with prescribed widths surrounding the contact faces of the through holes in the respective wiring sides in the contacting faces of the through holes and the respective wirings;

the circuits composed of a plurality of the lower layer wirings and a plurality of the upper layer wirings contacted through the through hole parts are made to be two independent contacted circuits extended respectively in the X-direction and the Y-direction as a whole; and the widths of the conformation margins are so adjusted as to be narrower in the X-direction than in the Y-direction in the X-direction contacted circuits and the widths are so adjusted as to be narrower in the Y-direction than in X-direction in the Y-direction contacted circuits.

For that, in the respective inventions as set forth in claim 6 to claim 8, gaps are easy to be formed in the through hole contact faces in the X-direction in the X-direction contacted circuits and gaps are easy to be formed in the through hole contact faces in the Y-direction in the Y-direction contacted circuits. Consequently, in the X-direction contacted circuits, it is easy to exceed the conformation margin width in the case where conformation difference is caused in the X-direction as compared with a case where conformation difference is caused in the Y-direction. On the other hand, in the Y-direction contacted circuits, it is easy to exceed the conformation margin width in the case where conformation difference is caused in the Y direction as compared with a case where conformation difference is caused in the X-direction. Hence, in the case where a slight conformation difference takes place in the X-direction, the conformation margin width of the X-direction contacted circuits is exceeded and, therefore, gaps are formed in the through hole contact faces in the X-direction exceeding the conformation margin width of the X-direction contacted circuits in the X-direction side to increase the electric resistance of the X-direction contacted circuits and to make the electric resistance to exceed an allowable range. On the other hand, in the case where a slight conformation difference takes place in the Y-direction, the conformation margin width of the Y-direction contacted circuits is exceeded and, therefore, gaps are formed in the through hole contact faces in the Y-direction exceeding the conformation margin width of the Y-direction contacted circuits in the Y-direction side to increase the electric resistance of the Y-direction contacted circuits and to make the electric resistance to exceed an allowable range. As a result, conformation difference caused in both directions can simultaneously be detected.

Further, if conformation difference is caused in either the X-direction or the Y-direction, corresponding to the extent of the contacted circuits, either the X-direction contacted circuits or the Y-direction contacted circuits, the electric resistance of the X-direction contacted circuits or the Y-direction contacted circuits is further increased. Consequently, the detection sensitivity of the conformation difference caused in both directions is improved.

Incidentally, each of the X-direction contacted circuits and the Y-direction contacted circuits may be composed of a plurality of rows of contacted circuits respectively connected in series.

Doing so, if conformation difference is caused in the X-direction or the Y-direction, corresponding to the extent of the increase of the contacted circuit connected in series, the electric resistance of the X-direction contacted circuits or the Y-direction contacted circuits is considerably increased.

Further, each of the foregoing X-direction contacted circuits and Y-direction contacted circuits may be formed to be continuous and rectangular wavy patterns in one direction when observed in a plane and through holes may be formed in the respective bending parts of the continuous and rectangular wavy patterns.

Doing so, if conformation difference is caused in the X-direction or the Y-direction, the electric resistance of the X-direction contacted circuits or the Y-direction contacted circuits is reliably increased and exceeds the allowable range.

The invention as set forth in claim 9 proposes a semiconductor device comprising one or more of semiconductor integrated circuits formed on a semiconductor substrate and conformation difference detection circuits formed on the same semiconductor substrate to detect the layering difference of the semiconductor integrated circuits:

wherein the conformation difference detection circuits are composed of a plurality of rows of circuit parts-to-be-measured and channel switching circuit parts for separately selecting the circuit parts-to-be-measured and contacting the selected circuit parts to a measuring apparatus in the outside;

each of the circuit parts-to-be-measured in a plurality of rows comprises a contacted circuit composed of a plurality of lower layer wirings and a plurality of upper layer wirings formed on the semiconductor substrate and through holes respectively successively contacting the terminal parts of respective upper layer wirings and the lower layer wirings in prescribed directions;

the electric resistance values of the respective circuit parts-to-be-measured are so adjusted as to be gradually increased to be higher than the electric resistance value of a specified circuit part-to-be-measured positioned in the center in both neighboring sides toward outside; and in relation to the electric resistance values of the respective circuit parts-to-be-measured positioned at object positions in both sides of the foregoing specified circuit part-to-be-measured in the center, the positioning difference of the through holes from the lower layer wirings and the upper layer wirings of circuit parts-to-be-measured positioned in one side is so set as to be a specified value obtained by keeping the positioning difference all over to a prescribed extent in one direction along the extension direction of circuit parts-to-be-measured; and at the same time the positioning difference of the through holes from the lower layer wirings and the upper layer wirings of circuit parts-to-be-measured positioned in the other side is so set as to be a specified value obtained by keeping the positioning difference all over to a prescribed extent, which is same as that of the circuit parts-to-be-measured positioned in the foregoing one side, in one direction along the extension direction of circuit parts-to-be-measured.

For that, in the semiconductor device of the invention as set forth in claim 9, if conformation difference is caused in one defined direction, the data of electric resistance values of easily changeable respective different circuit parts-to-be-measured is successively outputted to the outside at a high speed. Consequently, conformation difference detection caused in a specified one direction can quickly be carried out.

The invention as set forth in claim 10 is a semiconductor device comprising one or more of semiconductor integrated circuits formed on a semiconductor substrate and conformation difference detection circuits formed on the same semiconductor substrate to detect the layering difference of the semiconductor integrated circuits:

wherein the conformation difference detection circuits are composed of two detection circuits separately formed in the X-direction and the Y-direction, respectively and each difference detection circuit in the X-direction and the Y-direction is composed of a plurality of rows of circuit parts-to-be-measured and channel switching circuit parts for separately selecting the circuit parts-to-be-measured and contacting the selected circuit parts to a measuring apparatus in the outside;

each of the circuit parts-to-be-measured in a plurality of rows comprises a contacted circuit composed of a plurality of lower layer wirings and a plurality of upper layer wirings formed on the semiconductor substrate and through holes respectively successively contacting the terminal parts of respective upper layer wirings and the lower layer wirings in prescribed directions;

the electric resistance values of the respective circuit parts-to-be-measured are so adjusted as to be gradually increased to be higher values than the electric resistance value of a specified circuit part-to-be-measured positioned in the center in both neighboring sides toward outside; and in relation to the electric resistance values of the respective circuit parts-to-be-measured positioned at object positions in both sides of the foregoing specified circuit part-to-be-measured, the positioning difference of the through holes from the lower layer wirings and the upper layer wirings of circuit parts-to-be-measured positioned in one side is so set as to be a specified value obtained by keeping the positioning difference all over to a prescribed extent in one direction along the extension direction of circuit parts-to-be-measured; and at the same time the positioning difference of the through holes from the lower layer wirings and the upper layer wirings of circuit parts-to-be-measured positioned in the other side is so set as to be a specified value obtained by keeping the positioning difference all over to a prescribed extent, which is same as that of the circuit parts-to-be-measured positioned in the foregoing one side, in one direction along the extension direction of circuit parts-to-be-measured.

For that, in the semiconductor device disclosed in claim 10, if conformation difference is caused in the X-direction or the Y-direction, the data of electric resistance values of easily changeable respective different circuit parts-to-be-measured is successively outputted to the outside at a high speed. Consequently, conformation difference detection caused in a both directions can quickly be carried out.

BRIEF DESCRIPTION OF THE DRAWINGS

FIG. 4 is outline cross-section figures of the K part illustrated in FIG. 3.

FIG. 6 is outline cross-section figures of the L part illustrated in FIG. 5.

FIGS. 7 is figures showing one example of the case where the upper layer wirings 34 are shifted in the Y-direction.

FIG. 11 is a schematic illustration showing difference degrees of an X-direction difference detection circuit 42 and a Y-direction difference detection circuit 43 shown in FIG. 10;

FIG. 12 is schematic illustrations showing the difference degrees of object measurement circuits (43a, 43b, 43c) of the Y-direction difference detection circuit 43 shown in FIG. 11, FIG. 12C is a schematic illustration showing the difference degree d9 of the object measurement circuit 43a;

FIGS. 13 is outline plan views of an object measurement circuits 43b and 43d shown in FIG. 10.

FIGS. 14 is illustrations showing electric resistance values of the object measurement circuits (43a to 43e) shown in FIG. 11.

DETAILED DESCRIPTION OF THE PREFERRED EMBODIMENTS

[First Embodiment]

A first embodiment of the present invention is illustrated in FIG. 1 to FIG. 6.

Figure 3:
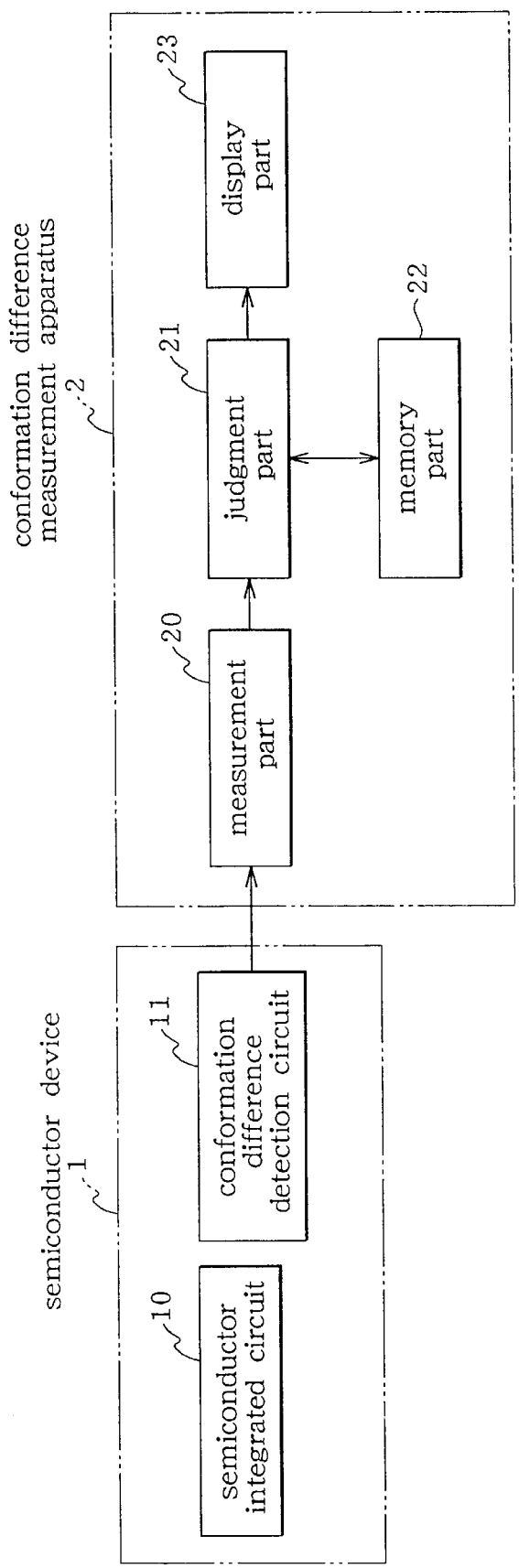
FIG. 3 is an entire constitution figure of a first embodiment of the present invention.

At first, the whole constitution is illustrated in FIG. 3.

In FIG. 3, reference numeral 1 denotes a semiconductor device. The semiconductor device 1 is provided with semiconductor integrated circuits 10, which are practical circuits, formed on a semiconductor substrate and conformation difference detection circuits 11 formed on the same semiconductor substrate for detecting the layering difference of the semiconductor integrated circuits 10.

Incidentally, the foregoing semiconductor integrated circuits 10 and the foregoing conformation difference detection circuits 11 are formed on one and same substrate by same fabrication process. Consequently, the layering difference is simultaneously caused in the foregoing semiconductor integrated circuits 10 and the foregoing conformation difference detection circuits 11 and for that, the layering difference of the semiconductor integrated circuits 10 is made possible to be detected indirectly by detecting the layering difference of the foregoing conformation difference detection circuits 11.

Reference numeral 2 denotes a conformation difference measuring apparatus. The conformation difference measuring apparatus 2 is formed separately from the foregoing semiconductor device 1and is provided with a measurement part 20 for measuring the electric resistance of the foregoing conformation difference detection circuits 11 and a judgment part 21 for judging whether the layering difference of the foregoing conformation difference detection circuits 11 is proper or not based on the measured value of the measurement part 20. Further, the conformation difference measuring apparatus 2 is provided with a memory part 22 for storing previously determined standard resistance values of the foregoing conformation difference detection circuits 11 and a display part 23 for displaying the determination results of the foregoing the judgment part 21.

In this case, the foregoing standard resistance values are resistance values calculated from the shapes of layers (or the conformation differences) in the foregoing conformation difference detection circuits 11 and used as data for judgment of the layering difference of the foregoing semiconductor integrated circuits 10.

Hence, by measuring the electric resistance values of the conformation difference detection circuits 11 by the conformation difference measuring apparatus 2, the conformation difference of the semiconductor integrated circuits 10 and abnormality of the through hole formation can indirectly and highly sensitively be detected.

Next, the foregoing conformation difference detection circuits 11 will more particularly be described.

Figure 2:
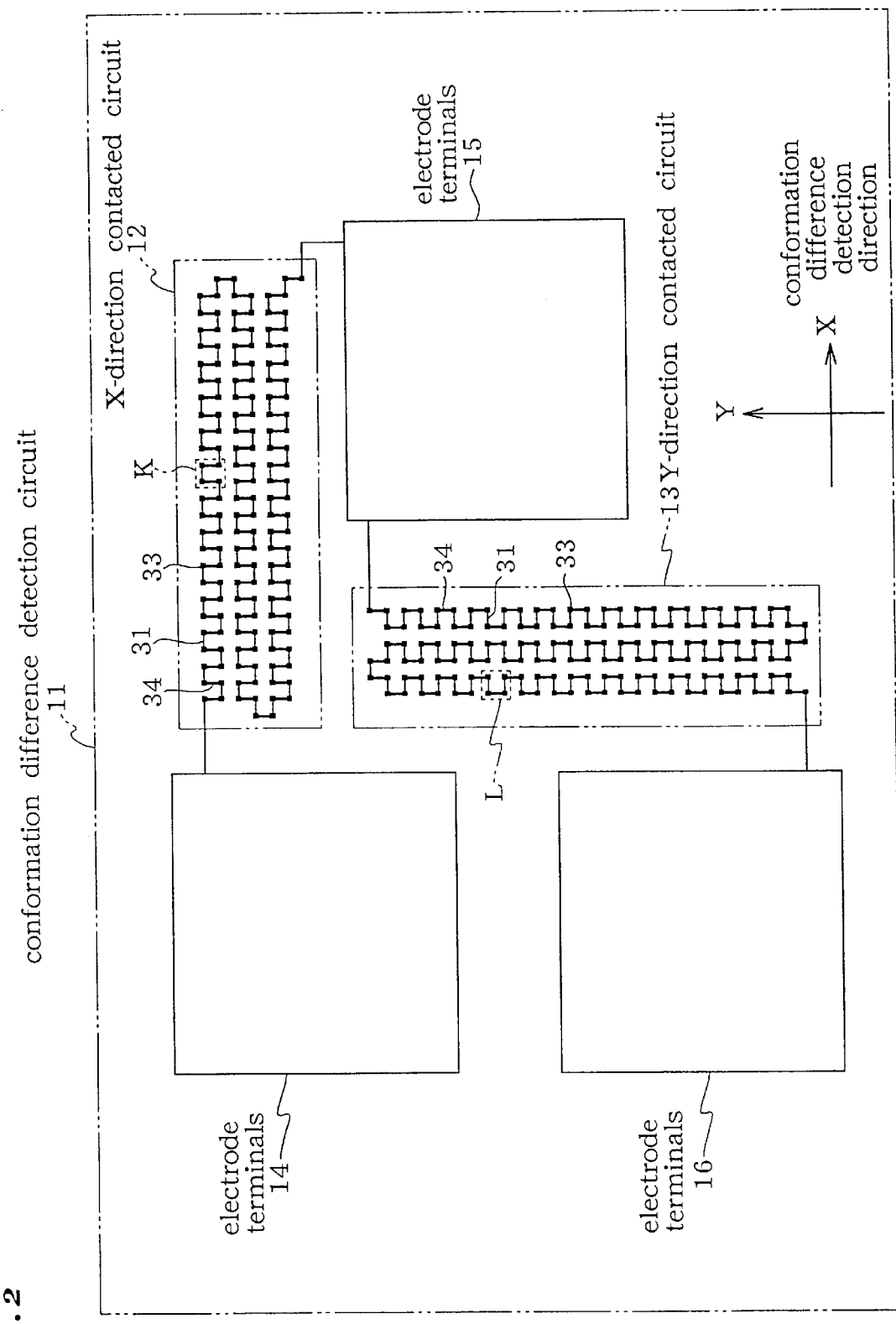
FIG. 2 is an outlines constitution figure of a conformation difference detection part 11 illustrated in FIG. 1.

A practical constitution of the conformation difference detection circuits 11 is illustrated in FIG. 2.

A conformation difference detection circuit 11 of FIG. 11 is provided with a plurality of lower layer wirings 31 formed on a semiconductor substrate, a plurality of upper layer wirings 34 layered on the lower layer wirings 31 through insulating layers 32, and through holes 33 successively and respectively contacting the respective upper layer wirings 34 and the lower layer wirings 31 in the X direction and in Y direction. Also, the conformation difference detection circuit 11 is provided with electrode terminals 14, 15, 16 set in both end parts of the circuits composed of the lower layer wirings 31 and the upper layer wirings 34 contacted through the through holes 33.

The conformation difference detection circuit 11 is composed of two independent contacted circuits (an X-direction contacted circuit 12 and a Y-direction contacted circuit 13) respectively formed by extending the foregoing lower layer wirings 31 and upper layer wirings 34 contacted through a plurality of the through hole parts 33 as a whole in the X-direction and Y-direction to respectively defined lengths. Incidentally, the reference characters X and Y of FIG. 2 respectively denote the X-direction and the Y-direction.

Next, the foregoing X-direction contacted circuit 12 and the foregoing Y-direction contacted circuit 13 will more particularly be described.

Figure 1:
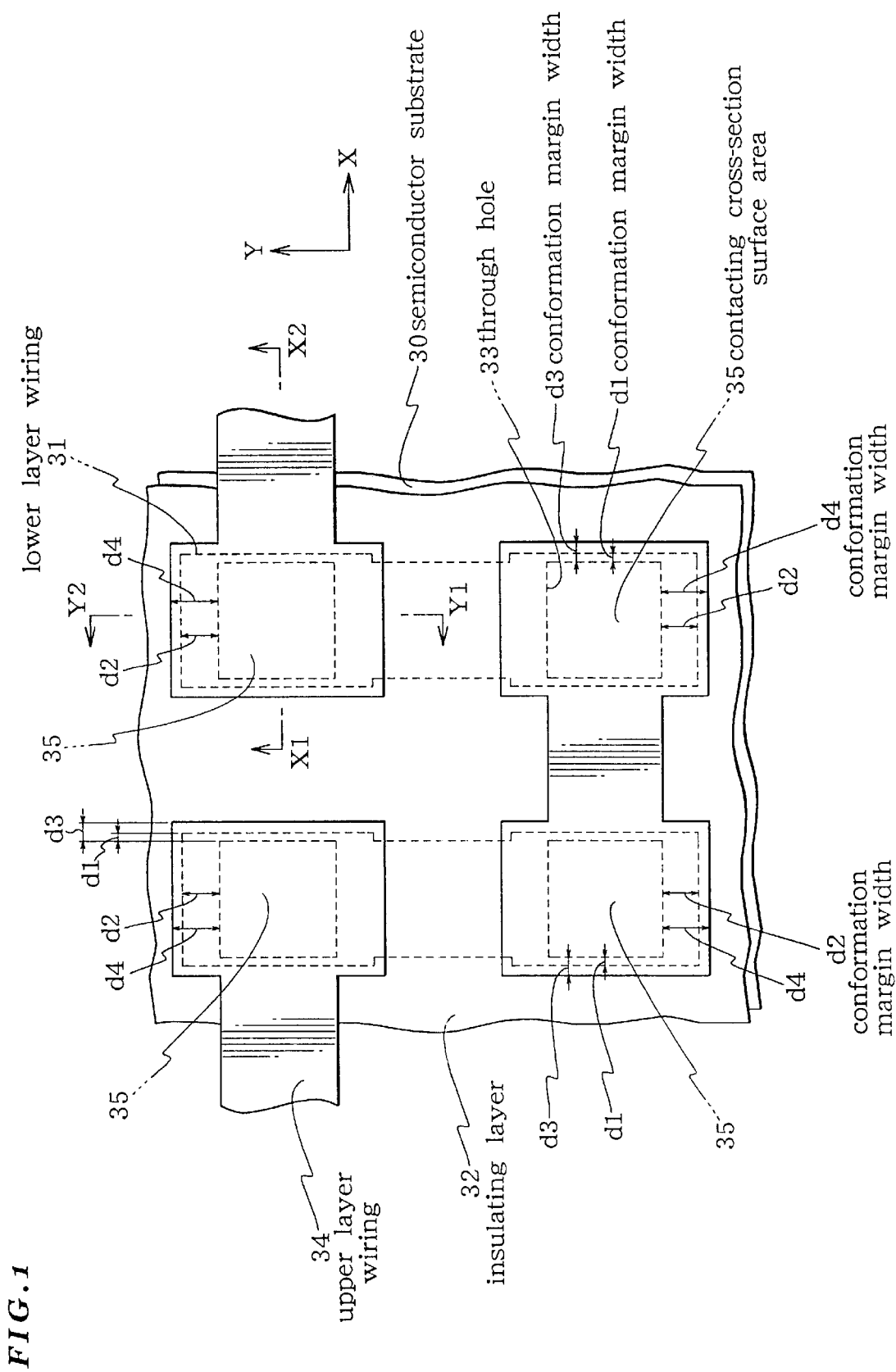
FIG. 1 is a detailed illustration showing a K part of an X-direction contacted circuit part 12 of FIG. 2.

Between them, at first, the X-direction contacted circuit 12 will be described. As illustrated in FIG. 1, the X-direction contacted circuit 12 is provided with the conformation margins in the X-direction and the Y-direction surrounding the contact faces of the foregoing through holes 33 in the respective upper and lower layer wirings 31, 34 sides of the contacting faces of the respective upper and lower layer wiring 31, 34 and the through holes 33. Regarding the conformation margin widths, the respective widths d1, d3 positioned in the X-direction are so set as to be narrower than the respective widths d2, d4 positioned in the Y-direction. Incidentally, the foregoing reference character d1, the foregoing reference character d2, the foregoing reference character d3, and the foregoing reference character d4 denote the conformation margin widths respectively in the lower layer wiring 31 side in the X-direction, in the lower layer wiring 31 side in the Y-direction, in the upper layer wiring 31 side in the X-direction, and in the upper layer wiring 31 side in the Y-direction. Additionally, the reference numeral 30 denotes a semiconductor substrate and the reference numeral 32 denotes an insulating layer in FIG. 1.

Hence. if conformation difference is caused between the through holes 33 and either the lower layer wirings 31 or the upper layer wirings 34 in the x-direction, since in the X-direction contacted circuit 12, the respective conformation margin widths d1, d3 in the X-direction are set to be narrower than the respective conformation margin widths d2, d4 in the Y-direction, gaps are easily formed in the through hole contact faces of the contacting parts of the through holes 33 and either the lower layer wirings 31 or the upper layer wirings 34. That is, in the contacting parts of the through holes 33 and either the lower layer wirings 31 or the upper layer wirings 34, it tends to be easy to decrease the surface areas of the contact faces (hereinafter referred to as "contacted cross-section surface areas 35") where the foregoing through holes 33 are brought into contact with either the lower layer wirings 31 or the upper layer wirings 34.

On the other hand, even if conformation difference is caused between the through holes 33 and either the foregoing lower layer wirings 31 or upper layer wirings 34 in the Y-direction, since the respective conformation margin widths d2, d4 in the Y-direction are so set as to be wider than the respective conformation margin widths d1, d3 in the X-direction in the X-direction contacted circuit 12, gaps are hardly formed in the through hole contact faces of the contacting parts of the through holes 33 and either the lower layer wirings 31 or the upper layer wirings 34. That is, it tends to becomes difficult to decrease the contacted cross-section surface areas 35 between the through holes 33 and either the lower layer wirings 31 or the upper layer wirings 34. Consequently, even if slight conformation difference is caused in the X-direction in the X-direction contacted circuit 12, the conformation margin widths d1, d3 are easily exceeded and therefore, the contacted cross-section surface areas 35 between the through holes 33 and either the lower layer wirings 31 or the upper layer wirings 34 are decreased and the electric resistance of the X-direction contacted circuit 12 is increased.

Further, the X-direction contacted circuit 12 is formed to be continuous and rectangular wavy patterns of the contacted circuits of the foregoing lower layer wirings 31 and upper layer wirings 33 by observation in a plane and at the same time through holes 33 are formed in the respective bending parts of the continuous and rectangular wavy patterns.

Further, as illustrated in FIG. 2, the foregoing X-direction contacted circuit 12 is composed of three rows of the foregoing contacted circuits and formed by contacting the respective contacted circuits in series.

For that, if conformation difference between the through holes 33 and either the foregoing lower layer wirings 31 or upper layer wirings 34 is caused in the X-direction in the X-direction contacted circuit 12, the electric resistance can further be increased in the X-direction contacted circuit 12 corresponding to even a slight conformation difference between the through holes 33 and either the lower layer wirings 31 or the upper layer wirings 34, attributed to the degree of the decrease of the contacted cross-section surface areas 35 between the through holes 33 and either the lower layer wirings 31 or the upper layer wirings 34 provided in three rows of the contacted circuit in series.

Figure 4A:
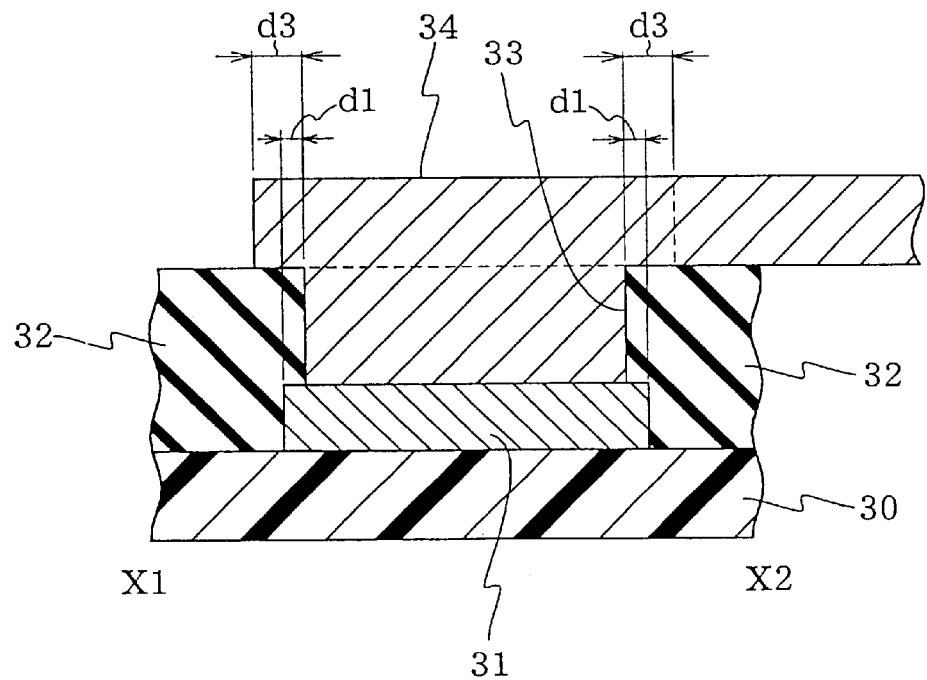
FIG. 4A is the outline cross-section figure cut along the X1–X2 line of FIG. 3
Figure 4B:
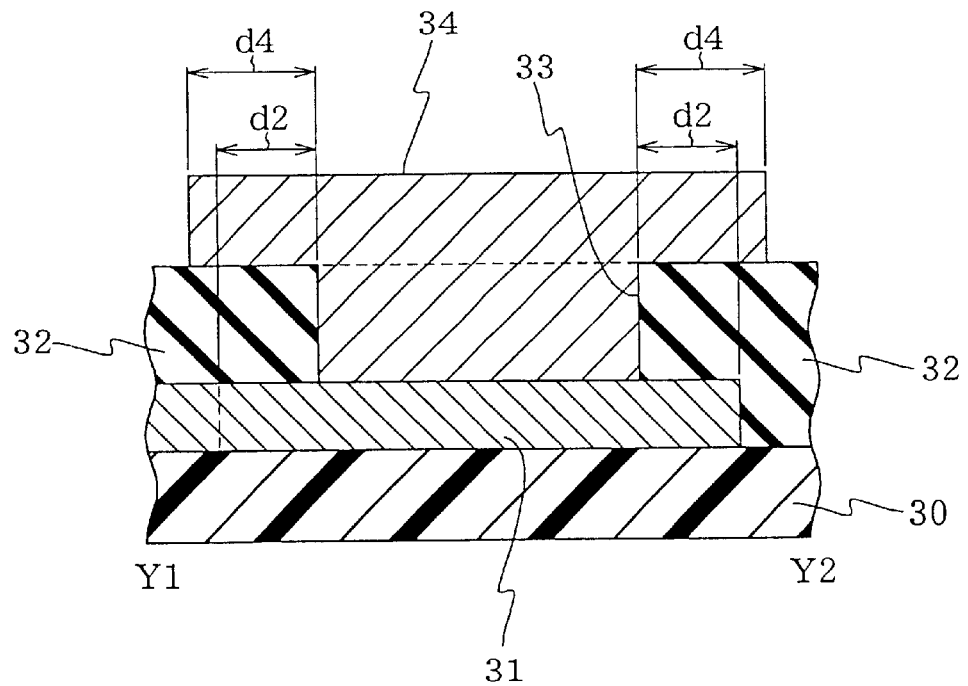
FIG. 4B is the outline cross-section figure cut along the Y1–Y2 line of FIG. 3.

The foregoing cross-section of the contacting faces of the through holes 33 and the respective upper and lower layer wirings 34, 31 in FIG. 2 is illustrated in FIGS. 4A, 4B.

In the contacting face in the X-direction illustrated in FIG. 4A, the foregoing conformation margin width d1 is set in the lower layer wiring 31 side of the contacting faces between the through holes 33 formed in the foregoing semiconductor substrate 30 and the foregoing lower layer wirings 31 as to surround the contact faces of the foregoing through holes 33. Also, the foregoing conformation margin width d3 is set in the upper layer wiring 34 side of the contacting faces between the through holes 33 formed on the foregoing semiconductor substrate 30 and the foregoing upper layer wirings 34 as to surround the contact faces of the foregoing through holes 33.

In the contacting face in the Y-direction illustrated in FIG. 4B, the foregoing conformation margin widths d2, d4 are set in the same manner as the foregoing contacting face in the X-direction in the respective lower layer wiring 31 side and in the upper layer wiring 34 side as to surround the contact faces of the foregoing through holes 33.

In this case, the foregoing respective conformation margin widths d1, d3 in the X-direction are so set as to be narrower than the foregoing respective conformation margin widths d2, d4 in the Y-direction.

For that, the X-direction contacted circuit 12 has the same function as that described in the description of FIG. 4A and at the same time, formation abnormality of the through holes 33, for example, cracking and the like in the through holes 33, the contacted cross-section surface areas 35 between the through holes 33 and either the lower layer wirings 31 or the upper layer wirings 34 are decreased and consequently, the electric resistance of the X-direction contacted circuit 12 can be increased.

Next, the Y-direction contacted circuit 13 will be described.

Figure 5:
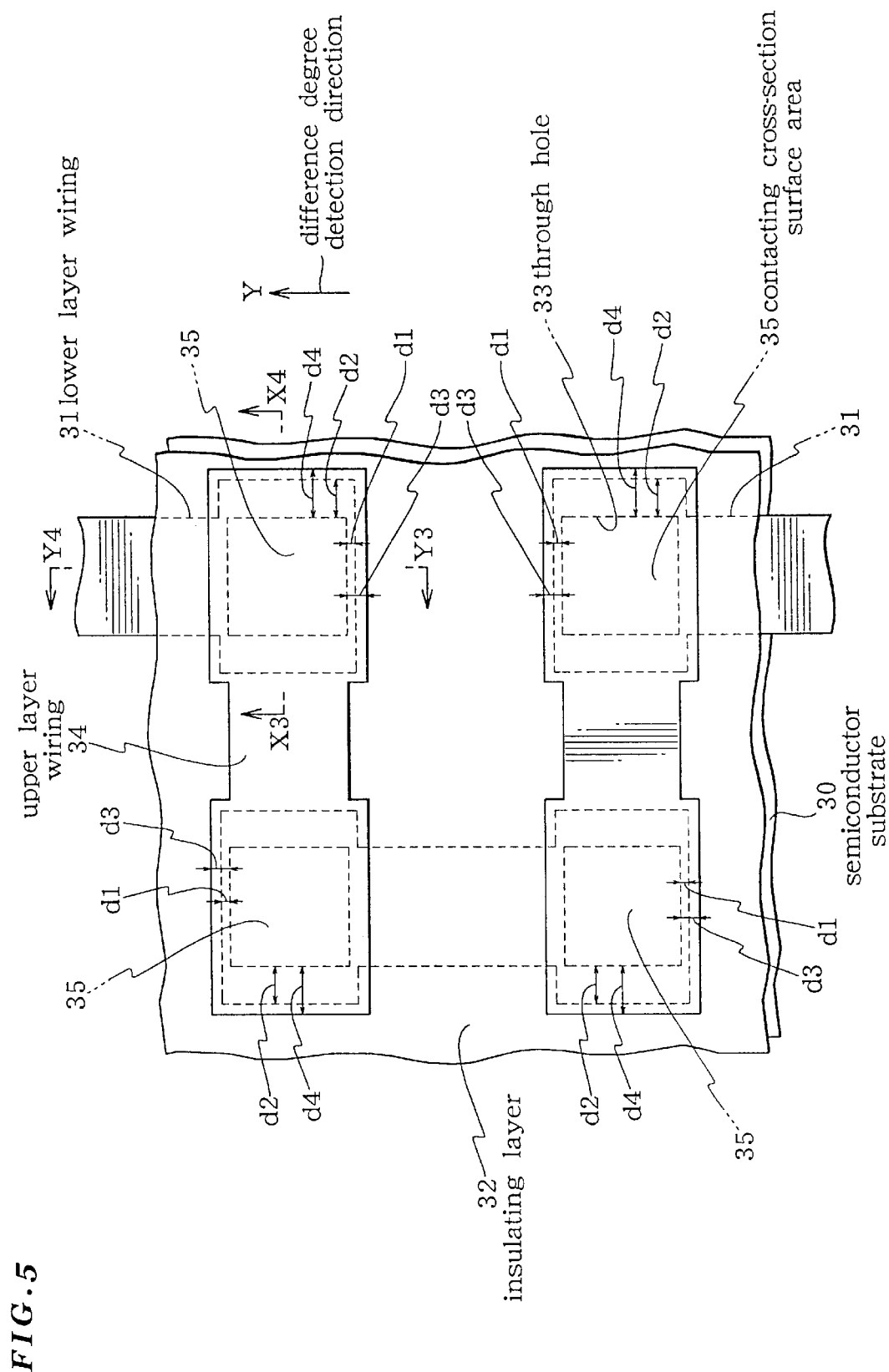
FIG. 5 is a detailed illustration showing a L part of the Y-direction contacted circuit part 13 of FIG. 2.

As illustrated in FIG. 5, the Y-direction contacted circuit 13 has a characteristic that the foregoing respective conformation margin widths d1, d3 positioned in the Y-direction are set to be narrower than the respective conformation margin widths d2, d4 positioned in the X-direction. In this case, the reference character d1, the foregoing reference character d2, the foregoing reference character d3, and the foregoing reference character d4 denote the conformation margin widths respectively in the lower layer wiring 31 side in the Y-direction, in the lower layer wiring 31 side in the X-direction, in the upper layer wiring 31 side in the Y-direction, and in the upper layer wiring 31 side in the X-direction.

Hence, if conformation difference is caused between the through holes 33 and either the foregoing lower layer wirings 31 or upper layer wirings 34 in the Y-direction in the Y-direction contacted circuit 13, since the respective conformation margin widths d1, d3 in the Y-direction are set to be narrower than the respective conformation margin widths d2, d4 in the X-direction, gaps are easily formed in the through hole contact faces of the contacting parts of the through holes 33 and either the lower layer wirings 31 or the upper layer wirings 34. That is, in the contacting parts of the through holes and either the lower layer wirings 31 or the upper layer wirings 34, it tends to be easy to decrease the surface areas of the contacted cross-section surface areas 35.

On the other hand, even if conformation difference is caused between the through holes 33 and either the foregoing lower layer wirings 31 or upper layer wirings 34 in the X-direction, since the respective conformation margin widths d1, d3 in the X-direction are so set as to be wider than the respective conformation margin widths d2, d4 in the X-direction in the Y-direction contacted circuit 13, gaps are hardly formed in the through hole contact faces of the contacting parts of the through holes 33 and either the lower layer wirings 31 or the upper layer wirings 34. That is, it tends to becomes difficult to decrease the contacted cross-section surface areas 35 between the through holes 33 and either the lower layer wirings 31 or the upper layer wirings 34. Consequently, even if slight conformation difference is caused in the Y-direction in the Y-direction contacted circuit 13, the conformation margin widths d1, d3 are easily exceeded and therefore, the contacted cross-section surface areas 35 between the through holes 33 and either the lower layer wirings 31 or the upper layer wirings 34 are decreased and the electric resistance of the Y-direction contacted circuit 13 is increased.

Figure 6A:
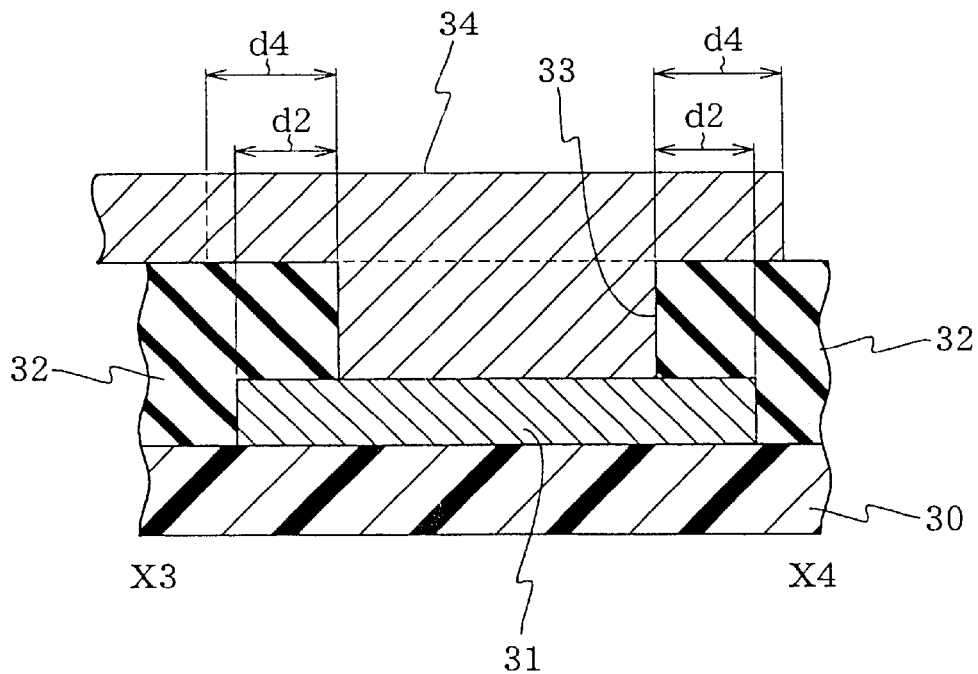
FIG. 6A is the outline cross-section figure cut along the X3–X4 line of FIG. 5
Figure 6B:
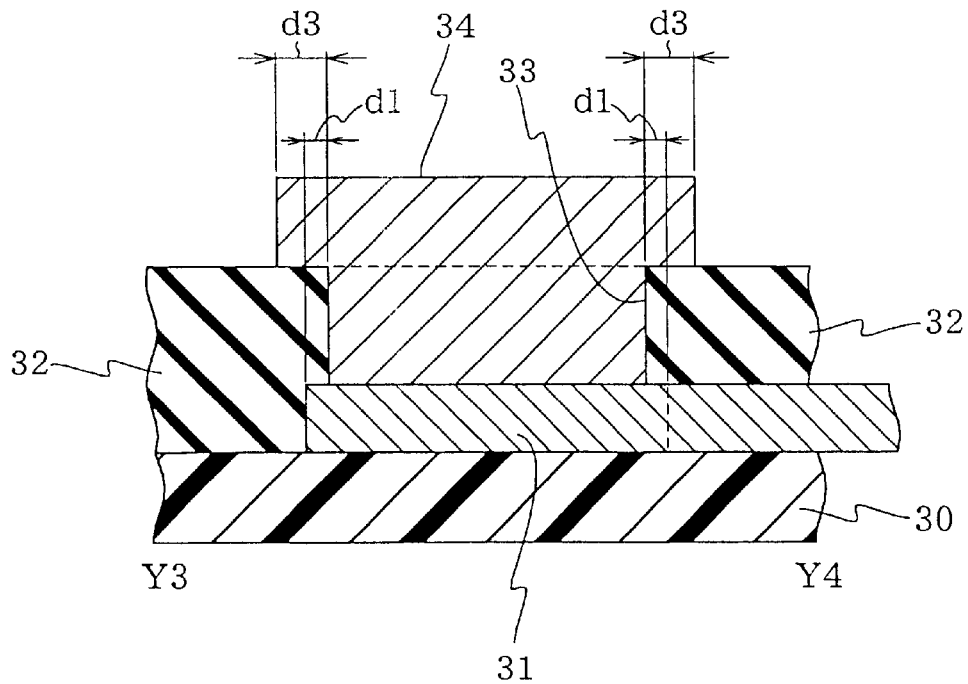
FIG. 6B is the outline cross-section figure cut along the Y3–Y4 line of FIG. 5.

Further, in the Y-direction contacted circuit 13, the cross-sections of the contacting faces of the through holes 33 and the respective upper and lower layer wirings 34, 31 illustrated in FIG. 2 are also set as to make the respective conformation margin widths d1, d3 in the foregoing Y-direction narrower than the respective conformation margin widths d2, d4 in the foregoing X-direction as illustrated in FIGS. 6A, 6B.

The constitution other than that is approximately same as that of the foregoing X-direction contacted circuit 12.

For that, the Y-direction contacted circuit 13 has almost the same function in the Y-direction as that of the X-direction contacted circuit 12.

Besides, the present embodiment as well is provided with known constitutions and functions necessary as a semiconductor device.

Incidentally, although that the conformation margin width is set evenly in the X-direction and in the Y-direction is exemplified in the present embodiment as the setting of the conformation margin widths in the X-direction contacted circuit 12 and the Y-direction contacted circuit 13 as illustrated in FIG. 2 and FIG. 5, it is not particularly required to set the conformation margin width evenly and, for example, is can be set wider in the X-direction. Also, it may be set wider in the Y-direction.

Further, in the present embodiment, although the semiconductor device 1 exemplified has a 3-layer structure, it is not particularly limited to have a 3-layer structure but have a layered structure of 4 or more layers.

In any case, almost same functional effects as those of the foregoing embodiment illustrated in FIG. 2 and FIG. 5 can be provided responding to the set values of the conformation margin widths.

Next, the function of a semiconductor device 1 constituted in the above described manner will be described with reference to FIGS. 7A, 7B in the case where conformation difference between the through holes 33 and the upper layer wirings 34 is caused by difference degree d5 in the negative direction of the Y-direction.

In this case the foregoing difference degree d5 is a value higher than the conformation margin width d2.

Figure 7A:
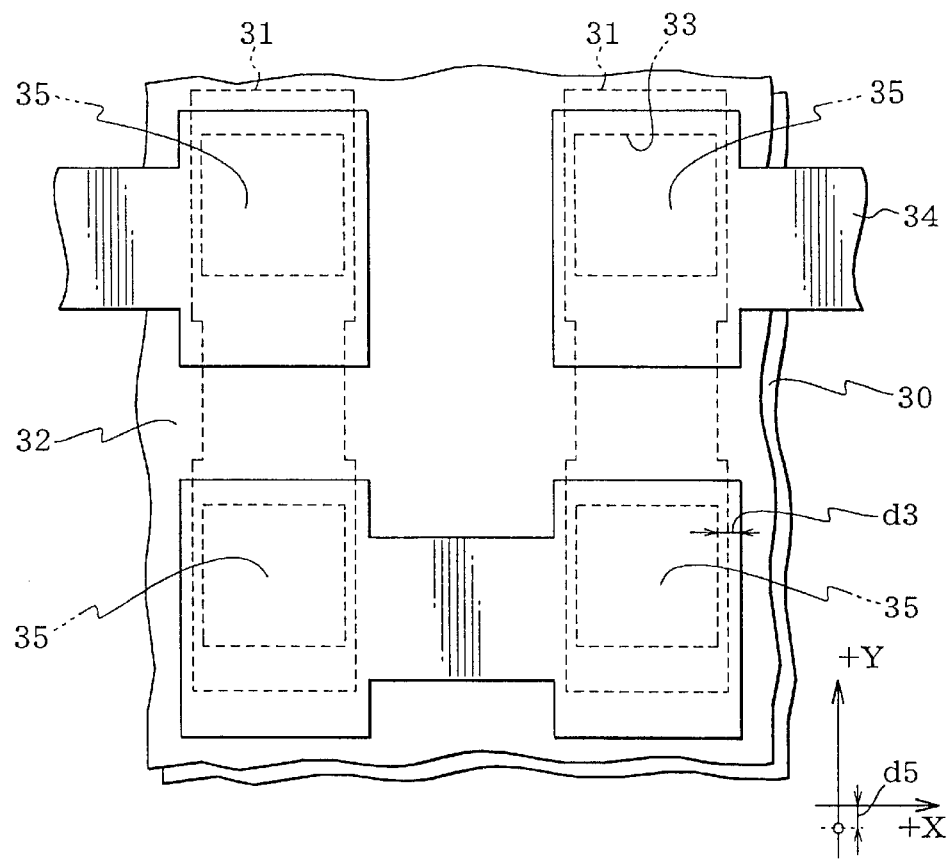
FIG. 7A is an outline plan view of an X-direction contacted circuit part 12 and FIG. 7B is an outline plan view of an X-direction contacted circuit part 13.

In the X-direction contacted circuit 12 of FIG. 7A, although conformation difference is caused between the upper layer wirings 34 and the through holes 33, since the conformation margin width d4 in the upper layer wirings 34 in the Y-direction is set to be wider than the conformation margin width d3 in the X-direction, the conformation difference does not exceed the conformation margin widths d2, d4. For that, contacted cross-section surface areas 35 of the upper layer wirings 34 and the through holes 33 become the same as those in the foregoing case illustrated in FIG. 3 and the X-direction contacted circuit 12 has approximately same electric resistance as that in the case where no conformation difference is caused between the upper layer wirings 34 and the through holes 33.

Figure 7B:
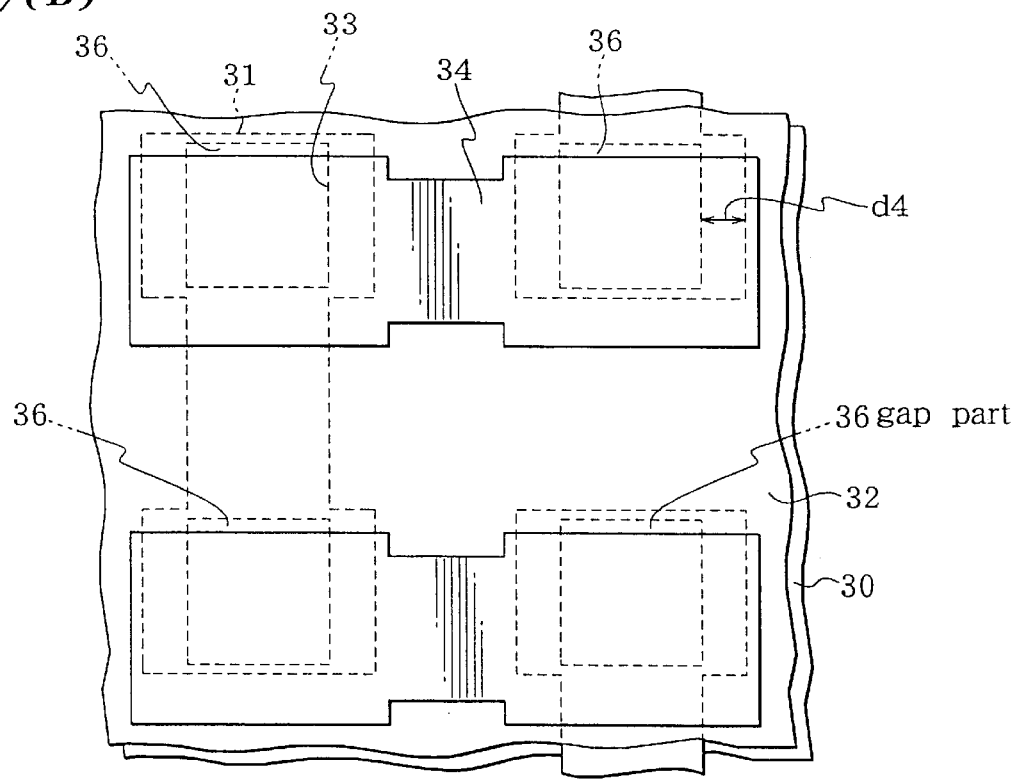

On the other hand, in the Y-direction contacted circuit 13 illustrated in FIG. 7B, since the conformation margin width d3 in the Y-direction is set to be narrower than the conformation margin width d4 in the X-direction, the conformation difference exceeds the conformation margin width d4 and gap parts 36 are formed in the through hole contact faces between the upper layer wirings 34 and the through holes 33. Hence, the contacted cross-section surface areas 35 between the upper layer wirings 34 and the through holes 33 are decreased as compared with those in the foregoing case illustrated in FIG. 5 and the electric resistance is increased as compared with that in the case where no conformation difference is caused between the upper layer wirings 34 and the through holes 33.

For that, only in the case the conformation difference between the upper layer wirings 34 and the through holes 33 is caused in the X-direction between the X-direction and the Y-direction, the electric resistance of the X-direction contacted circuit 12 is increased and in such a point, it certainly solves a conventional problem that electric resistance of a detection circuit is increased equally regardless of the conformation difference directions.

In this case, although the exemplified difference degree d5 of the foregoing conformation difference is defined as that between the upper layer wirings 34 and the through holes 33 as illustrated in FIG. 7 in the present embodiment, it is not particularly limited to the case between the upper layer wirings 34 and the through holes 33 and it may be set to be, that, for example, between the lower layer wirings 31 and the through holes 33. Also, the direction of the foregoing conformation difference may be in the positive direction of the Y-direction.

In any case, approximately same functional effects as those of the foregoing embodiment illustrate in FIG. 7 can be obtained.

Further in the case where the conformation difference is caused by the difference degree d5 between the foregoing the upper layer wirings 34 and the through holes 33 in the X-direction, since the conformation margin width d3 in the X-direction of the foregoing X-direction contacted circuit 12 is set to be narrower than the conformation margin width d4 in the Y-direction, approximately same functional effects as those of the foregoing embodiment illustrated in FIG. 7 can be obtained in the X-direction. That is, the electric resistance of the X-direction contacted circuit 12 between the X-direction contacted circuit 12 and the Y-direction contacted circuit 13 is increased.

As described above, if conformation difference is caused in the X-direction and in the Y-direction, the electric resistance of the X-direction contacted circuit 12 or the Y-direction contacted circuit 13 can be increased responding to the setting of the respective conformation margin widths (d1, d2, d3, d4) of the foregoing X-direction contacted circuit 12 and Y-direction contacted circuit 13. Consequently, the electric resistance of the X-direction contacted circuit 12 and the Y-direction contacted circuit 13 can simultaneously be increased corresponding to the conformation difference directions and in such a point, the direction of the conformation difference is enabled to be detected.

Further, as the foregoing conformation difference, exemplified is a case where gaps 36 are formed in the through hole contact faces of the contacting parts of the upper layer wirings 34 and the through holes 33 in this embodiment as illustrated in FIG. 7, however without particularly causing the gap parts 36 in the foregoing contacting faces, the contacted cross-section surface areas 35 between the through holes 33 and either the lower layer wirings 31 or the upper layer wirings 34 are decreased also in the case, for example, where cracks are formed in the through holes 33. Therefore, the electric resistance of the X-direction contacted circuit 12 or the Y-direction contacted circuit 13 is set to be higher than that in the case illustrated in FIG. 3 and FIG. 5.

Figure 8:
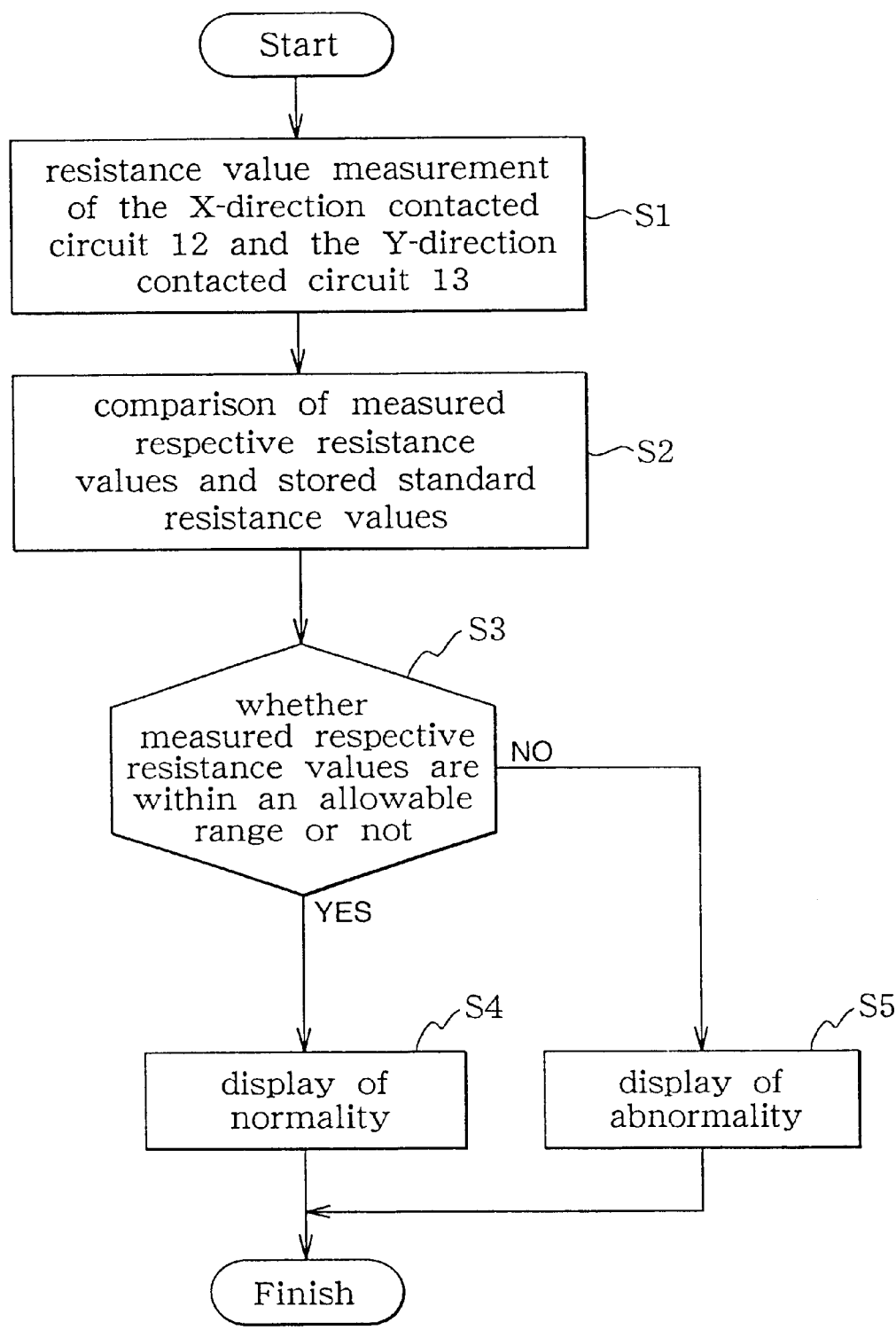
FIG. 8 is a flow chart showing an operation of a conformation difference measurement apparatus 2.

Next, the operation of the conformation difference detection apparatus 2 for detecting the conformation difference in the semiconductor device 1 constituted as described above will be described along with the flow chart of FIG. 8. Also, the conformation difference in the semiconductor device 1 at that time will be described with the reference to FIG. 7A, 7B.

At first, the measurement part 20 measures the electric resistance of the X-direction contacted circuit 12 through an electrode 14 and an electrode 15. Further, the measurement part 20 measures the electric resistance of the Y-direction contacted circuit 13 through the electrode 14 and an electrode 16 (Step S1). Incidentally, regarding the foregoing measurement of the electric resistance, the foregoing measurement part 20 computes based on the electric current values flowing at the time when prescribed voltage is applied to the electrodes 14, 15, 16.

In this case, since contacted cross-section surface areas 35 between the through holes 33 and either the lower layer wirings 31 or the upper layer wirings 34 are not changed in the X-direction contacted circuit 12 (reference to FIG. 7A), the measurement part 20 measures approximately same electric resistance as the electric resistance in the case where no conformation difference is caused in the X-direction contacted circuit 12. On the other hand, since contacted cross-section surface areas 35 between the through holes 33 and the upper layer wirings 34 are decreased in the Y-direction contacted circuit 13 (reference to FIG. 7B), the measurement part 20 measures high electric resistance as compared with the electric resistance in the case where no conformation difference is caused in the Y-direction contacted circuit 13.

Next, the judgment part 21 compares the measured resistance value of the X-direction contacted circuit 12 and the measured resistance value of the Y-direction contacted circuit 13 with the standard resistance values stored in the memory part 22, respectively (Step S2).

In this case, the measured resistance value of the foregoing X-direction contacted circuit 12 is compared with the standard resistance value calculated based on the shape (or the conformation difference) of the X-direction contacted circuit 12 and the measured resistance value of the foregoing Y-direction contacted circuit 13 is compared with the standard resistance value calculated based on the shape (or the conformation difference) of the Y-direction contacted circuit 13.

Next, the judgment part 21 judges whether the measured resistance value of the X-direction contacted circuit 12 and the measured resistance value of the Y-direction contacted circuit 13 are respectively within the allowable ranges or not (Step S3).

Incidentally, the allowable ranges of the measured resistance value of the X-direction contacted circuit 12 and the measured resistance value of the Y-direction contacted circuit 13 are the resistance values in the case where no gap is formed in the through hole contact face of the contacting faces of the through holes 33 and either the lower layer wirings 31 or the upper layer wirings 34. The allowable ranges can properly be set corresponding to the conformation difference detection precision and not necessarily limited to the above described ranges.

In this case, the judgment part 21 judges that the measured resistance value of the X-direction contacted circuit 12 within the allowable range (Step S3) in the X-direction contacted circuit 12 since the measured resistance value is the resistance value in the case where no gap is formed in the through hole contact face of the contacting faces of the through holes 33 and either the lower layer wirings 31 or the upper layer wirings 34. Then, the judgment part 21 makes the display part 23 display that the measured resistance value of the X-direction contacted circuit 12 is normal (Step S4).

On the other hand, the judgment part 21 judges that the measured resistance value of the Y-direction contacted circuit 13 exceeds the allowable range (Step S3) since the measured resistance value of the Y-direction contacted circuit 13 becomes the resistance value in the case where gaps are formed in the through hole contact faces of the through holes 33 and the upper layer wirings 34. Then, the judgment part 21 makes the display part 23 display that the measured resistance value of the Y-direction contacted circuit 13 is abnormal (Step S5).

In such a manner, if conformation difference is caused between the through holes 33 and the upper layer wirings 34 in the Y-direction, depending on the setting of the conformation margin widths (d1, d2, d3, d4) of the X-direction contacted circuit 12 and the Y-direction contacted circuit 13, only the measured resistance value of the Y-direction contacted circuit 13 exceeds the allowable range and thus the resistance abnormality in the Y-direction contacted circuit 13 can be detected. Consequently, that conformation difference is caused in the Y-direction can be detected and at such a point, a conventional problem (that the conformation difference direction cannot be detected) can validly be avoided. Further, since the X-direction contacted circuit 12 and the Y-direction contacted circuit 13 are composed of 3 rows of contacted circuits connected in series, also at this point, the detection sensitivity is kept high.

[Second Embodiment]

A second embodiment is illustrated in FIG. 9 to FIG. 13.

Figure 9:
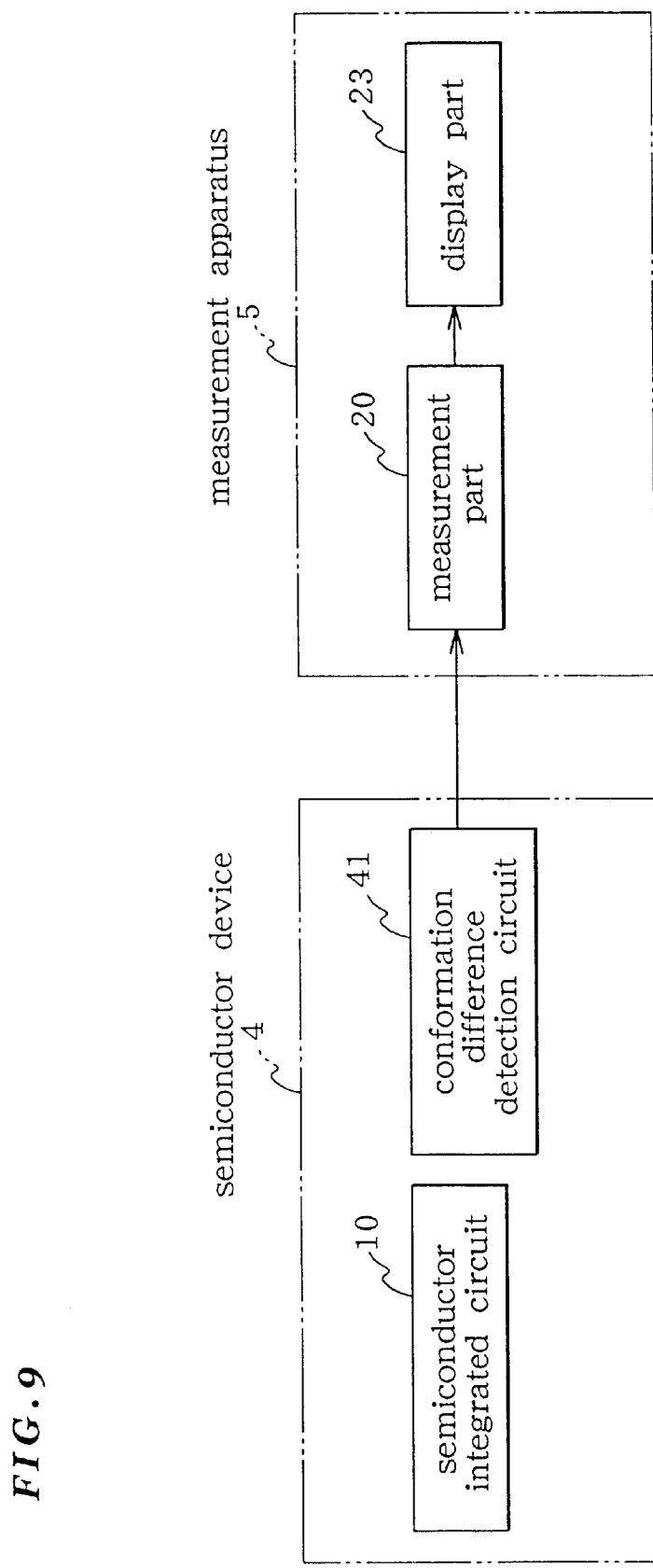
FIG. 9 is an illustration showing a second embodiment of the present invention.

The second embodiment illustrated in FIG. 9 has a characteristic that a difference detection circuit 41 is installed instead of the conformation difference detection circuit 11 in the foregoing first embodiment. Further, the second embodiment also has a characteristic that a measurement apparatus 5 is composed of the measurement part 20 and the judgment part 21 of the conformation difference measurement apparatus 2 of the foregoing first embodiment It will further particularly be described.

Figure 10:
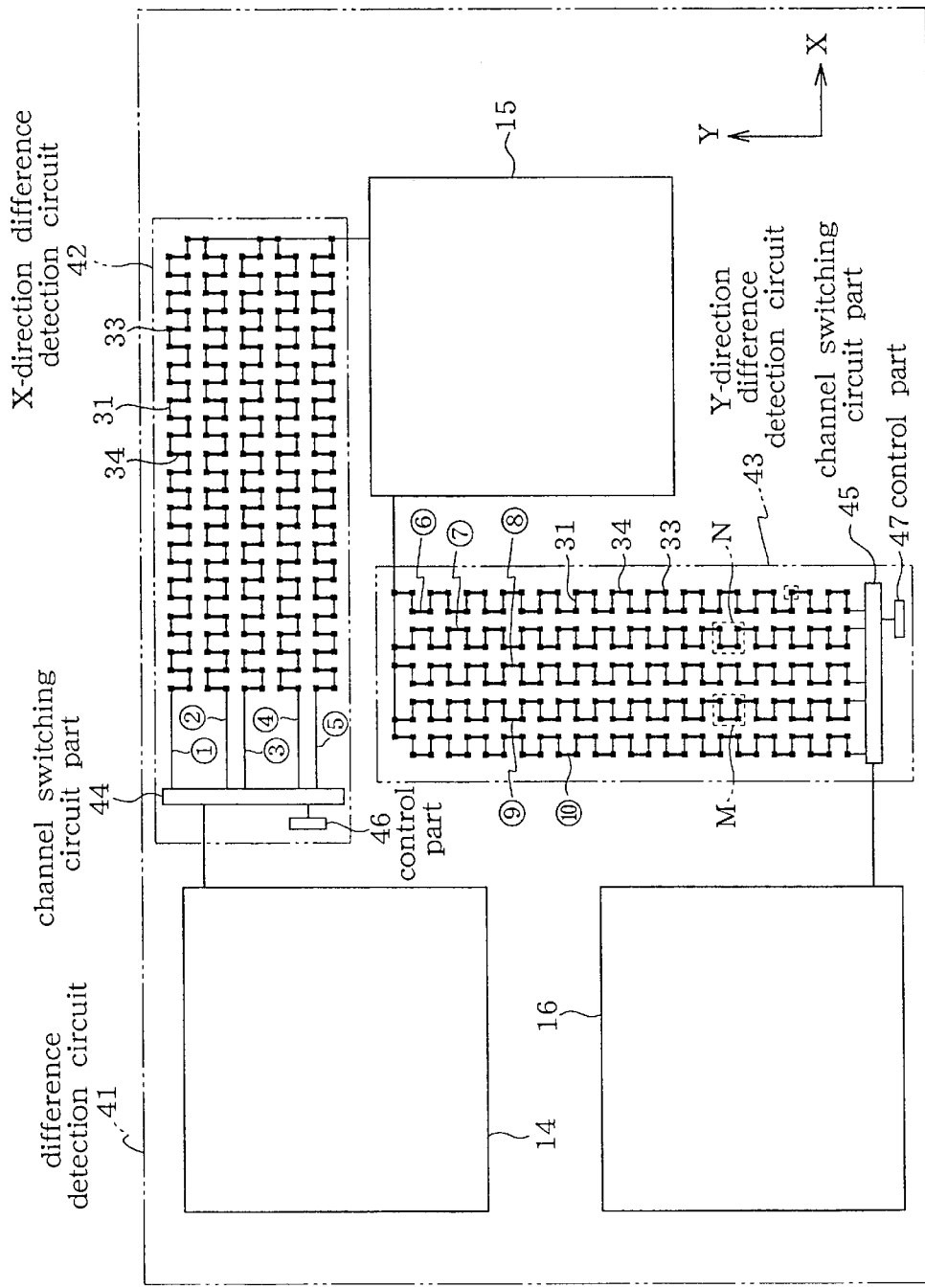
FIG. 10 is an outlines constitution figure of a difference detection circuit 41 shown in FIG. 9.

A practical constitution of a difference detection circuit 41 is illustrated in FIG. 10

The difference detection circuit 41 of FIG. 10 is composed of an X-direction difference detection circuit 42 and a Y-direction difference detection circuit 43 respectively independently formed in the X-direction and the Y-direction. Between them, the X-direction difference detection circuit 42 is composed of 5 rows of (a plurality of) circuit parts-to-be-measured (42a to 42e) with different electric resistance values and a channel switching circuit part 44 for separately selecting the respective circuit parts-to-be-measured (42a to 42e) and contacting them to a measurement apparatus 5 in the outside. The channel switching circuit part 44 is so constituted as to successively output the information of the positions and electric resistance of the foregoing respective circuit parts-to-be-measured (42a to 42e) as control signals from the control part 46 at a high speed to the measurement apparatus 5. Further, the Y-direction difference detection circuit 43 is composed of 5 rows of (a plurality of) circuit parts-to-be-measured (43a to 43e) with different electric resistance values and a channel switching circuit part 45 for separately selecting the respective circuit parts-to-be-measured (43a to 43e) and contacting them to the measurement apparatus 5 in the outside. The channel switching circuit part 45 is so constituted as to successively output the information of the positions and electric resistance of the foregoing respective circuit parts-to-be-measured (43a to 43e) as control signals from the control part 47 at a high speed to the measurement apparatus 5.

For that, the information of the different electric resistance values of the respective circuit parts-to-be-measured (42a to 42e, 43a to 43e) of the foregoing X-direction difference detection circuit 42 and Y-direction difference detection circuit 43 can respectively be outputted to the measurement apparatus 5 in the outside through the foregoing respective the channel switching circuit parts 44 and 45.

Further, each of the circuit parts-to-be-measured (42a to 42e) of the foregoing X-direction difference detection circuit 42 is composed of a plurality of lower layer wirings 31 formed on a semiconductor substrate 30, a plurality of upper layer wirings 34, and through holes 33 successively and respectively contacting the respective end parts of the foregoing respective upper layer wirings 34 and lower layer wirings 31 in the X-direction (in one constant direction). Further, each of the circuit parts-to-be-measured (43a to 43e) of the foregoing Y-direction difference detection circuit 43 is composed of a plurality of lower layer wirings 31 formed on a semiconductor substrate 30, a plurality of upper layer wirings 34, and through holes 33 successively and respectively contacting the respective end parts of the foregoing respective upper layer wirings 34 and lower layer wirings 31 in the Y-direction (in one constant direction).

Hence, the electric resistance values of the respective circuit parts-to-be-measured (42a to 42e, 43a to 43e) of the foregoing X-direction difference detection circuit 42 and Y-direction difference detection circuit 43 can be identified by approximately the same technique of the foregoing first embodiment.

Further, among the electric resistance values of the respective circuit parts-to-be-measured (42a to 42e, 43a to 43e) of the foregoing X-direction difference detection circuit 42 and Y-direction difference detection circuit 43, the electric resistance values of the respective circuit parts-to-be-measured (42a, 42b, 42d, 42e, 43a, 43b, 43d, 43e) in both neighboring sides toward outside other than the specified circuit parts-to-be-measured (42c, 43c) positioned in the center are so adjusted as to be gradually increased to be higher than the electric resistance values of the specified circuit parts-to-be-measured.

Here, description will be given with reference of FIG. 11, FIG. 12, and FIG. 13 regarding the setting of the electric resistance values of the respective circuit parts-to-be-measured (42a to 42e, 43a to 43e) of the foregoing X-direction difference detection circuit 42 and Y-direction difference detection circuit 43.

FIG. 11 illustrates the difference degrees between the through holes 33 and the lower layer wirings 31 in the respective circuit parts-to-be-measured (42a to 42e, 43a to 43e) in the X-direction difference detection circuit 42 and the Y-direction difference detection circuit 43.

In FIG. 11, the difference degrees between the through holes 33 and the lower layer wirings 31 in the respective circuit parts-to-be-measured (43a, 43b) in positioned one side (the positive direction side along the X-direction) of the Y-direction difference detection circuit 43 are respectively set to be values (prescribed values) d8, d9 obtained by shifting as a whole by prescribed degrees in the negative direction along the Y-direction (the extension direction) of the respective circuit parts-to-be-measured (43a, 43b). In this case, the foregoing difference degree d9 is the value of the circuit part-to-be-measured 43a and the foregoing difference degree d8 is the value of the circuit part-to-be-measured 43b.

Further, in FIG. 11, the difference degrees between the through holes 33 and the lower layer wirings 31 in the respective circuit parts-to-be-measured (43d, 43e) positioned in the other side (the negative direction side along the X-direction) of the Y-direction difference detection circuit 43 are respectively set to be values (prescribed values) d8, d9 obtained by shifting as a whole by prescribed degrees, which are same as the difference degrees d8, d9 of the circuit parts-to-be-measured (43a, 43b) positioned in the foregoing one direction, in the positive direction along the Y-direction of the respective circuit parts-to-be-measured (43d, 43e). In this case, the foregoing negative difference degree d9 is the value of the circuit part-to-be-measured 42e and the foregoing positive difference degree d8 is the value of the circuit part-to-be-measured 42d, respectively. Further in FIG. 11, the difference degree of the specified circuit part-to-be-measured 43c of the foregoing Y-direction difference detection circuit 43 is shown to be zero. Furthermore, the electric resistance values of the respective circuit parts-to-be-measured (42a to 42e) of the foregoing X-direction difference detection circuit 42 are also set as to be shifted by the same difference degrees in the X-direction as same as those in the case of the foregoing respective circuit parts-to-be-measured (43a to 43e) in the Y-direction.

Figure 12A:
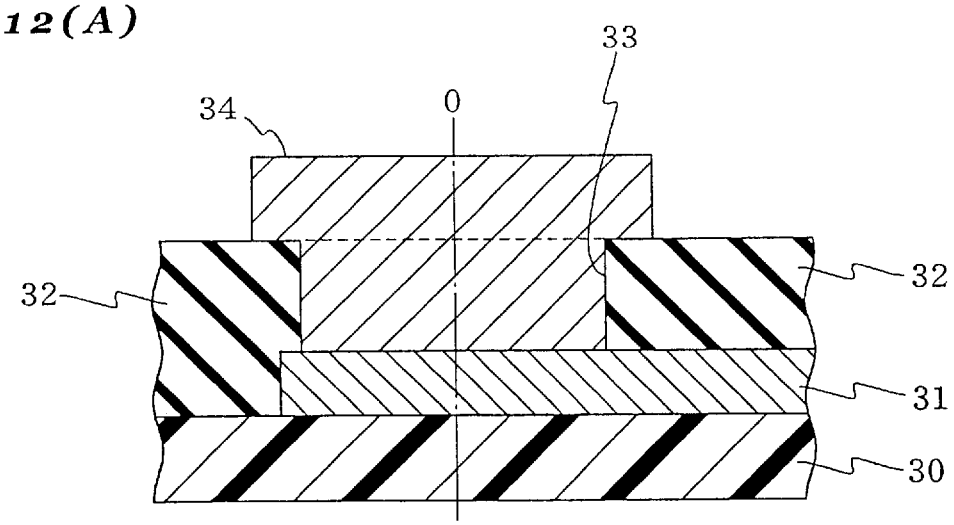
FIG. 12A is a schematic illustration showing zero difference degree of the object measurement circuit 43c.
Figure 12B:
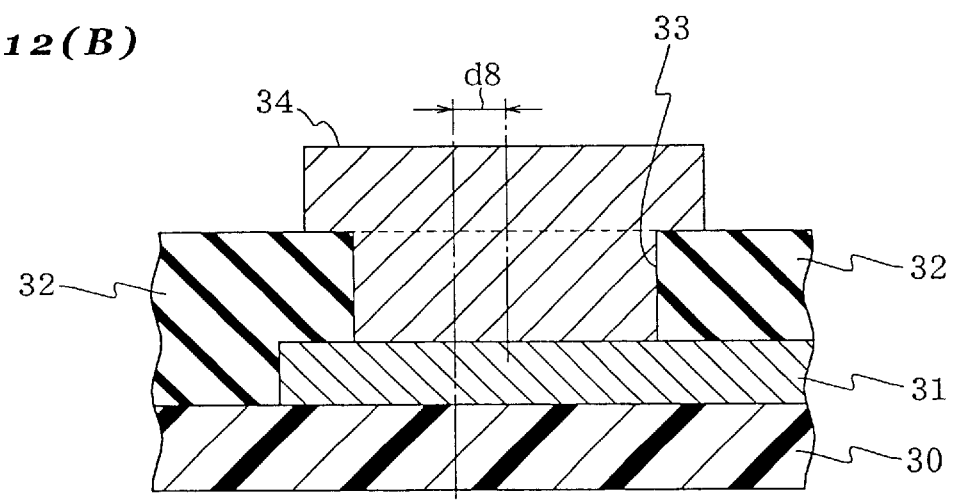
FIG. 12B is a schematic illustration showing the difference degree d8 of the object measurement circuit 43b.
Figure 12C:
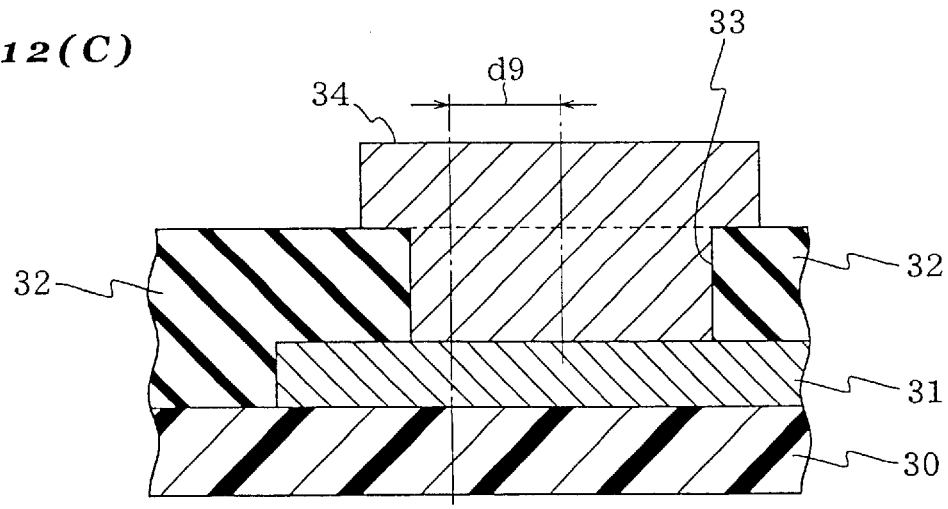

FIGS. 12A, 12B, 12C illustrate foregoing difference degrees (0, d8, d9) of the circuit parts-to-be-measured (43c, 43b, 43a) illustrated in FIG. 11 in the cross-sections of the contacting faces of the through holes 33 and the respective the upper and lower layer wirings 34, 31.

The difference degrees (0, d8, d9) illustrated in FIGS. 12A, 12B, 12C are so set as to be the difference widths between the center lines of the contact faces of the contacting faces of the foregoing lower layer wirings 31 and the through holes 33 and the center lines of the contact faces of the contacting faces of the through holes 33 and the foregoing upper layer wirings 34. Further, the difference degrees (d8, d9) of the foregoing circuit parts-to-be-measured (43d, 43e) are respectively set in the different direction from that of the foregoing difference widths in FIGS. 12B and 12C.

Hence, the sizes of the contacted cross-section surface areas 35 of the lower layer wirings 31 and the through holes 33 are set to be respectively different by setting the foregoing difference degrees (0, 8d, 9d) in the respective circuit parts-to-be-measured (42a to 42e, 43a to 43e) of the X-direction difference detection circuit 42 and the Y-direction difference detection circuit 43 and consequently, the electric resistance values are set to be different in the respective circuit parts-to-be-measured (42a to 42e, 43a to 43e) of the X-direction difference detection circuit 42 and the Y-direction difference detection circuit 43.

Figure 13A:
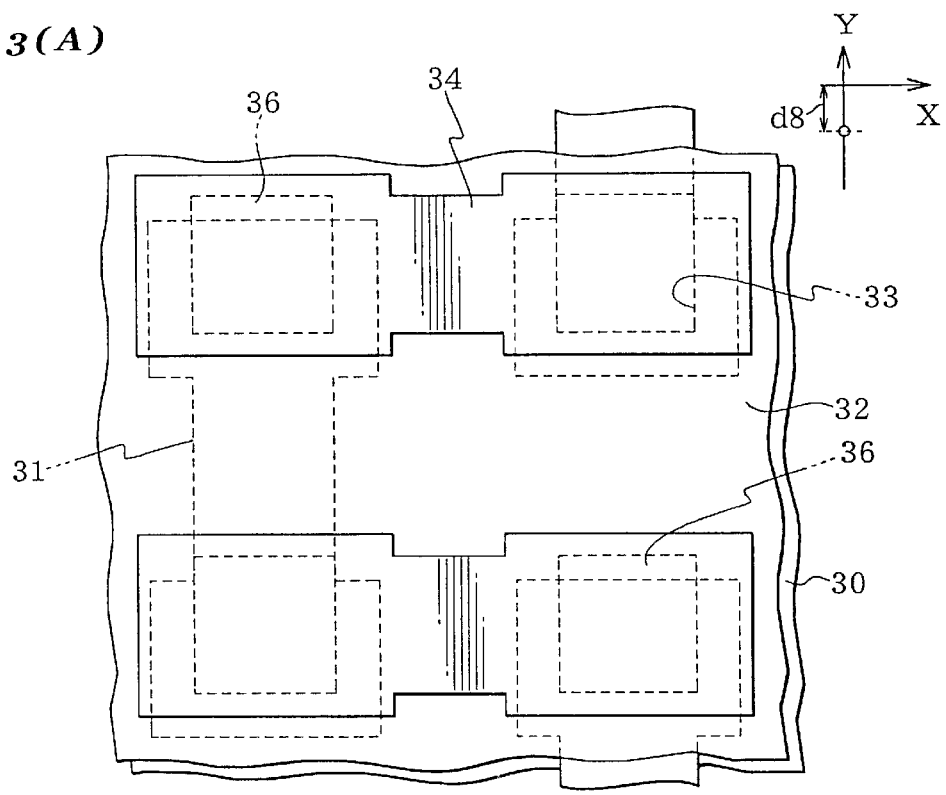
FIG. 13A is a detailed schematic illustration showing an M part of FIG. 10
Figure 13B:
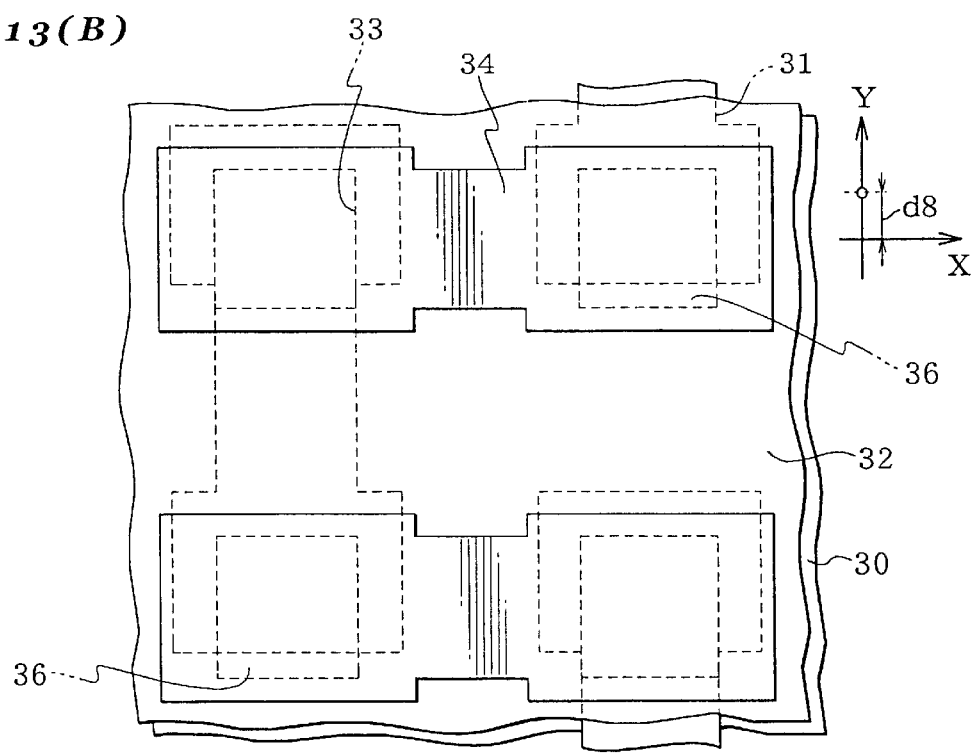
FIG. 13B is an outline cross-section figure showing an N part of FIG. 10.

FIGS. 13A, 13B respectively illustrate outline plan views of some of the respective circuit parts-to-be-measured (43b, 43e) of the foregoing Y-direction difference detection circuit 43.

In the respective circuit parts-to-be-measured (43b, 43e) of the foregoing Y-direction difference detection circuit 43 of FIGS. 13A, 13B, gap parts 36 are set in the through holes 33 as to decrease the foregoing contacted cross-section surface areas 35 as compared with those in the foregoing circuit part-to-be-measured 42c.

In this case, the gap parts 36 in the respective circuit parts-to-be-measured (43b, 43e) of the foregoing Y-direction difference detection circuit 43 are made equal and thus the electric resistance values of both circuit parts-to-be-measured (43b, 43e) are set to be equal. Also, the electric resistance values of the circuit parts-to-be-measured (43a, 43e) in the foregoing Y-direction difference detection circuit 43 are set to be the same electric resistance values attributed to approximately same functional effects of the foregoing cases illustrated in FIGS. 13.

That will more particularly be described.

Figures 14A, 14B:
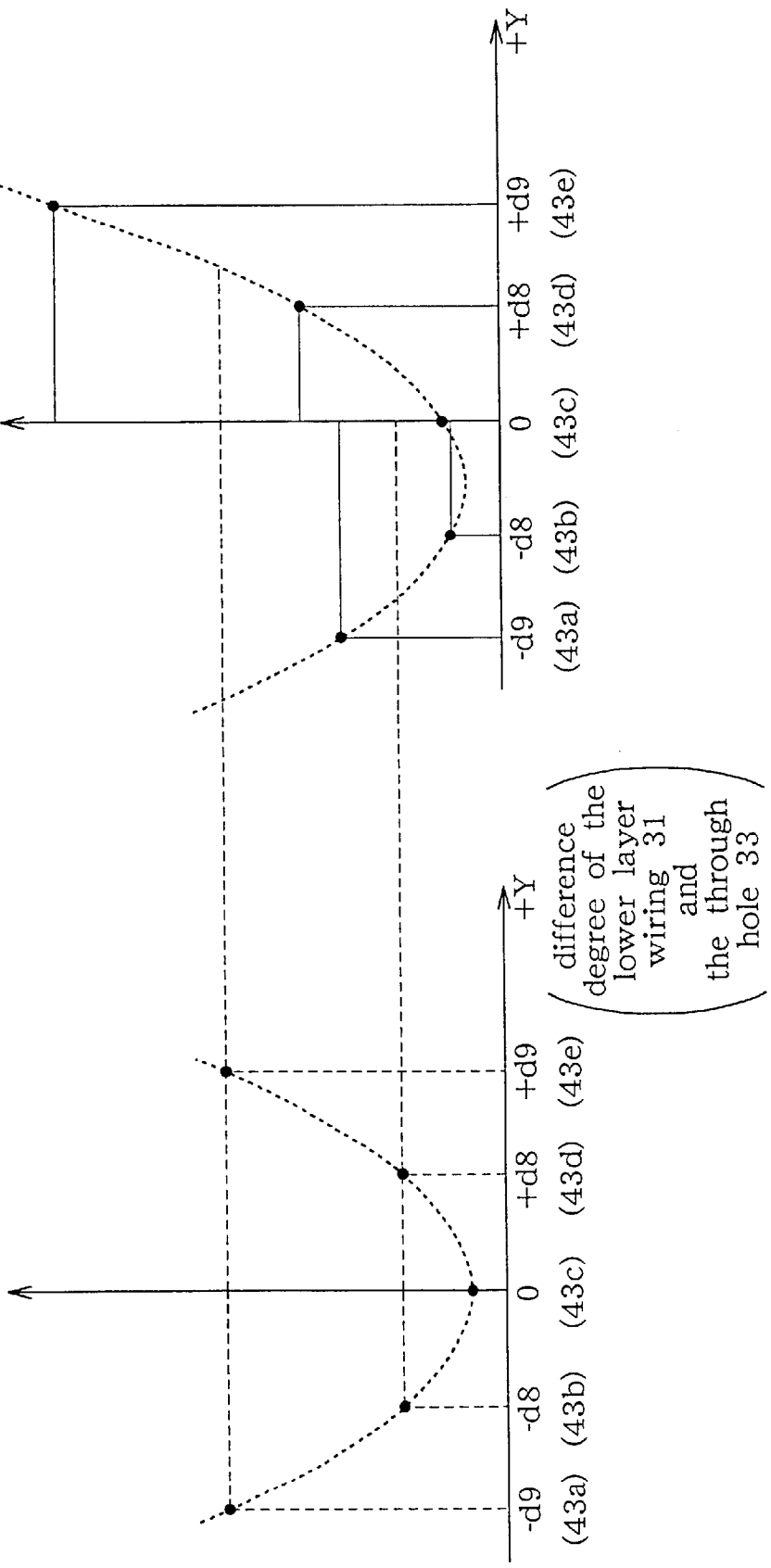
FIG. 14A is an illustration showing the correlation between the difference degrees and the electric resistance values shown in FIG. 11.
FIG. 14B is an illustration showing the correlation between the difference degrees and the electric resistance values in the case where the lower layer wirings 31 are shifted in the positive direction along the Y-direction.
Figure 15:
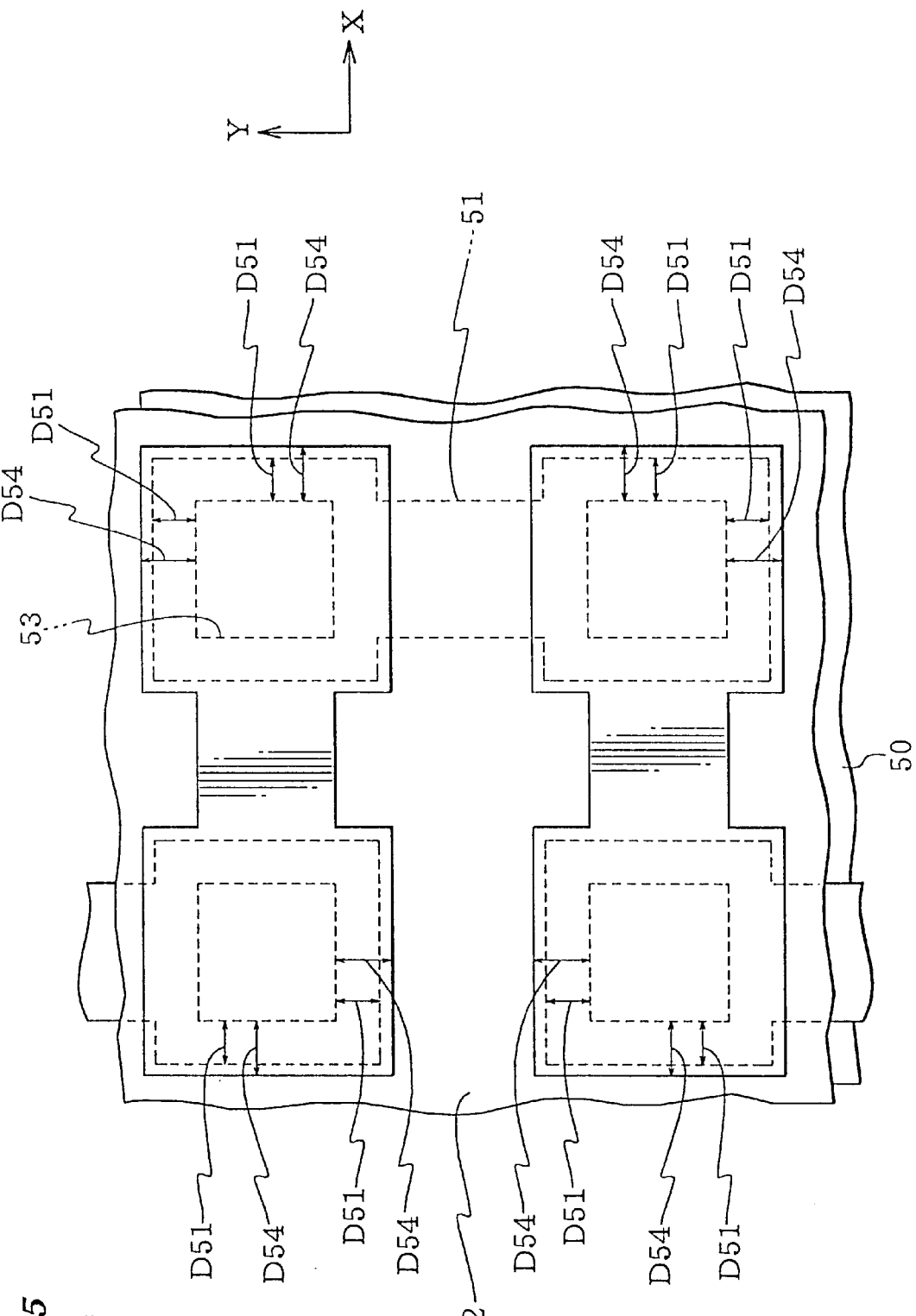
FIG. 15 is an illustration showing a conventional example.

FIGS. 14A, 14B illustrate the correlation of the difference degrees and the electric resistance values of the circuit parts-to-be-measured (43a to 43e) of the foregoing Y-direction difference detection circuit 43. In FIGS. 14A, 14B, the axis of abscissas shows the difference degrees of the lower layer wirings 31 and the through holes 33 and the axis of ordinates shows the electric resistance values of the circuit parts-to-be-measured (43a to 43e). Further, in FIGS. 14A, 14B, the curves of the dotted lines show the correlation of the difference degrees and the electric resistance values calculated from the shape or the like of the Y-direction difference detection circuit 43.

Between FIGS. 14A, 14B, FIGS. 14A shows the minimum values of the electric resistance values of a specified circuit part-to-be-measured 43c. Further, the electric resistance values of the respective circuit parts-to-be-measured (43a, 43b) positioned in the foregoing one side and the electric resistance values of the respective circuit parts-to-be-measured (43d, 43e) positioned in the other side are respectively the same values on the electric resistance value of the specified circuit part-to-be-measured 43c as the symmetric axis.

Also, FIG. 14B shows the electric resistance values of the circuit parts-to-be-measured (43a to 43e) in the case where the conformation difference is caused in the positive direction along the Y-direction of, for example, the lower layer wirings 31.

In the circuit parts-to-be-measured (43a, 43b) in FIG. 14B, the electric resistance values are decreased as compared with those in FIG. 14A. The electric resistance value of the foregoing circuit part-to-be-measured 43b is shown to be the minimum value among the electric resistance values of the circuit parts-to-be-measured (43a to 43e). That is because the surface areas of foregoing gap parts 36 are narrowed in the foregoing circuit parts-to-be-measured (43a, 43b) as compared with those in FIG. 14A and the foregoing contacted cross-section surface areas 35 are increased.

In contrast with that, the electric resistance values are increased in the circuit parts-to-be-measured (43c, 43d, 43e) in FIG. 14B as compared with those in FIG. 14A. That is because the surface areas of foregoing gap parts 36 are enlarged in the foregoing circuit parts-to-be-measured (43c, 43d, 43e) as compared with those in FIG. 14A and the foregoing contacted cross-section surface areas 35 are decreased.

Consequently, in the case where the conformation difference is caused in the positive direction along the Y-direction of the lower layer wirings 31, the electric resistance values of the circuit parts-to-be-measured (43a, 43b) are decreased as compared with those shown in FIG. 14A and the electric resistance values of the circuit parts-to-be-measured (43c, 43d, 43e) are increased as compared with those shown in FIG. 14A.

Further, in the case where the foregoing conformation difference is caused in the semiconductor integrated circuits 10, the electric resistance value of the specified circuit part-to-be-measured 43c positioned in the center is so set as not to be the minimum value. That is, if the electric resistance value of the specified circuit part-to-be-measured 43c is set to be the minimum value, it means that no conformation difference is caused.

Incidentally, in the case where conformation difference is caused in the negative direction along the Y-direction of the lower layer wirings 31 in the semiconductor integrated circuits 10, the same functional effects as described above are caused in the negative direction along the Y-direction. That is, the electric resistance value of either one of the circuit parts-to-be-measured (42d, 42e) is set to be the minimum value.

In this case, although the description of the difference degree of the foregoing circuit parts-to-be-measured (43a to 43e) in the present embodiment is given, as illustrated in FIG. 11, exemplifying the case of the lower layer wirings 31 and the through holes 33, it is not at all necessary to set in the lower layer wirings 31 but the difference degree may be set between the upper layer wirings 34 and the through holes 33. Further, although the setting of the difference degree of the circuit parts-to-be-measured (43a to 43e) is described exemplifying the case of setting the equal difference degree in the positive and the negative directions along the Y-direction, it is not at all necessary to particularly set the difference degree equal but the difference degree can be set to be high, for example, in the positive direction.

Further, the foregoing difference detection circuit 43 may be composed of, for example, 3-rows of circuit parts-to-be-measured.

In any case, approximately same functional effects as those of the foregoing embodiment illustrated in FIG. 11 can be obtained corresponding to the difference degree.

Further, the constitutions and the functional effects of the circuit parts-to-be-measured (42a to 42e) of the foregoing X-direction difference detection circuit 42 in FIG. 10 can be obtained approximately equally to the case of the circuit parts-to-be-measured (43a to 43e) of the foregoing Y-direction difference detection circuit 43.

In this case, the functional effects same as those in circuit parts-to-be-measured (43a to 43e) of the foregoing Y-direction difference detection circuit 43 are obtained in the circuit parts-to-be-measured (42a to 42e) of the X-direction difference detection circuit 42 in the case where the conformation difference is caused in the X-direction.

Hence, the information of the different electric resistance values of the respective circuit parts-to-be-measured (42a to 42e, 43a to 43e) of the foregoing X-direction difference detection circuit 42 and Y-direction difference detection circuit 43 can respectively and successively be outputted to the measurement apparatus 5 in the outside through the foregoing respective the channel switching circuit parts 44 and 45. That is, the information of the different electric resistance values changed by the conformation difference and shown in FIG. 14B can respectively and quickly be outputted to the measurement apparatus 5. As a result, the conformation difference caused in the X-direction and the Y-direction can quickly be detected.

Next, the following is the description of the operation of the measurement apparatus 5 connected to the difference detection circuit 41 of the semiconductor device 4 constituted as described above. Further, description will be given with the reference of FIG. 14B regarding the conformation difference in the semiconductor device 1 at the time of the operation.

At first, the measurement part 20 quickly gets inputs of the information of the different electric resistance values of the circuit parts-to-be-measured (42a to 42e, 43a to 43e) of the foregoing X-direction difference detection circuit 42 and Y-direction difference detection circuit 43 through the foregoing respective channel switching circuit parts 44, 45 and measures the electric resistance values of the respective circuit parts-to-be-measured (42a to 42e, 43a to 43e). Incidentally, regarding the foregoing measurement of the electric resistance, the foregoing measurement part 20 computes the electric resistance values based on the electric current values flowing at the time when prescribed voltage is applied to the electrodes 14, 15, 16.

The display part 24 displays the respectively different electric resistance values of the respective circuit parts-to-be-measured (42a to 42e, 43a to 43e) transmitted from the foregoing measurement part 20. Also, the display part 24 is enabled to display the standard resistance values computed from the shape (or the conformation difference) of the circuit parts-to-be-measured (42a to 42e, 43a to 43e) of the foregoing X-direction difference detection circuit 42 and Y-direction difference detection circuit 43, too.

In this case, regarding the electric resistance values of the circuit parts-to-be-measured (42a to 42e) of the X-direction difference detection circuit 42, the foregoing display part 20 displays the same electric resistance values as those equivalent to the set values of the difference degree (reference to FIG. 14A). On the other hand, regarding the electric resistance values of the circuit parts-to-be-measured (43a to 43e) of the Y-direction difference detection circuit 43, the foregoing display part 20 displays the electric resistance values of the circuit parts-to-be-measured (43a, 43b) while decreasing the values and the electric resistance values of the circuit parts-to-be-measured (43c, 43d, 43e) while increasing the values. Further, the electric resistance values of the foregoing circuit part-to-be-measured 43b is displayed as the minimum value (reference to FIG. 14B).

Hence, that the electric resistance value of the specified circuit part-to-be-measured 43c is no t the minimum value can quickly be specified and therefore, the occurrence of conformation difference in the Y-direction in the semiconductor integrated circuits 10 can easily and quickly be detected.

Further, that the electric resistance values of the circuit parts-to-be-measured (43a, 43b) are decreased and that the electric resistance values of the circuit parts-to-be-measured (43c, 43d, 43e) are increased can quickly be specified and therefore, the occurrence of the conformation difference in the positive direction along the Y-direction in the semiconductor integrated circuits 10 is also made possible to be evaluated.

Incidentally, regarding the conformation difference in the foregoing semiconductor device 1, as illustrated in FIG. 14B, although the case where conformation difference is caused in the lower layer wirings 31 in the positive direction along the Y-direction is exemplified in this embodiment, it is not necessarily limited to that but it is also valid, for example, in the case where conformation difference is caused in the negative direction along the Y-direction. Further, the conformation difference may be caused in the upper layer wiring 34 side and furthermore it may be caused in the X-direction.

In any case, similar functional effects to those described in the case of the foregoing electric resistance values shown in FIG. 14B can be obtained by the foregoing difference detection circuit 41.

In the invention disclosed in claim 1, since the conformation margin width positioned in one direction is set to be narrower than the conformation margin width positioned in the other direction, gaps are made easy to be formed in the through hole contact faces in the former direction side. Hence, it is made easy to exceed the conformation margin width in the case where the conformation difference to a prescribed extent is caused in the former direction as compared with the case where the conformation difference to a prescribed extent is caused in the latter direction. Consequently, even if a slight conformation difference is caused in the former direction, the conformation margin width is easily exceeded and therefore, gaps are formed in the through hole contact faces in the former direction and the electric resistance of the conformation difference detection circuits is increased and exceeds the allowable range. As a result, the detection sensitivity of the conformation difference caused in one specified direction can be improved.

In the invention disclosed in claim 2, besides the foregoing functional effects of the invention of claim 1, since the conformation difference detection circuits are made to be continuously contacted circuits continued in one direction, the detection sensitivity of the conformation difference caused in the specified one direction can considerably be improved. For example, the detection sensitivity of the conformation difference in the specified one direction can be improved as high as three times by composing the conformation difference detection circuits by connecting 3 rows of contacted circuits in series.

In the invention disclosed in claim 3, besides the foregoing functional effects of the invention of claim 2, since at least 2 rows of contacted circuits are connected in series, the detection sensitivity of the conformation difference caused in the specified one direction can further be increased corresponding to the degree of the increase of the contacted circuits connected in series.

In the invention disclosed in claim 4, besides the foregoing functional effects of each invention of claim 2 and claim 3, since the contacted circuits are made to be rectangular wavy and continuous patterns, the detection sensitivity of the conformation difference caused in the specified one direction can reliably be increased and at the same time the contacted circuits are made easy to be formed.

In the invention disclosed in claim 5, besides the foregoing functional effects of each invention of claims 2, 3, and 4, since the one direction is set to be the X-direction and the other direction to be the Y-direction, the detection sensitivity of the conformation difference caused in the specified X-direction at right angles to the Y-direction can reliably be increased.

In the invention disclosed in claim 6, since the conformation margin width positioned in the X-direction of the X-direction contacted circuits are set to be narrower than the conformation margin widths positioned in the Y-direction and the conformation margin width positioned in the Y-direction of the Y-direction contacted circuits is set to be narrower than the conformation margin widths positioned in the X-direction, gaps are easy to be formed in the through hole contact faces in the X-direction in the X-direction contacted circuits and gaps are easy to be formed in the through hole contact faces in the Y-direction in the Y-direction contacted circuits. Consequently, in the X-direction contacted circuits, it is easy to exceed the conformation margin width in the case where conformation difference is caused in the X-direction as compared with a case where conformation difference is caused in the Y-direction. On the other hand, in the Y-direction contacted circuits, it is easy to exceed the conformation margin width in the case where conformation difference is caused in the Y direction as compared with a case where conformation difference is caused in the X-direction. Hence, in the case where a slight conformation difference takes place in the X-direction, the conformation margin width of the X-direction contacted circuits is exceeded and, therefore, gaps are formed in the through hole contact faces in the X-direction exceeding the conformation margin width of the X-direction contacted circuits in the X-direction side to increase the electric resistance of the X-direction contacted circuits and to make the electric resistance to exceed an allowable range. On the other hand, in the case where a slight conformation difference takes place in the Y-direction, the conformation margin width of the Y-direction contacted circuits is exceeded and, therefore, gaps are formed in the through hole contact faces in the Y-direction exceeding the conformation margin width of the Y-direction contacted circuits in the Y-direction side to increase the electric resistance of the Y-direction contacted circuits and to make the electric resistance to exceed an allowable range. As a result, conformation difference caused in both directions can simultaneously be detected.

Further, since the X-direction contacted circuits and the Y-direction contacted circuits are made to be contacted circuits, the detection sensitivity of the conformation difference caused in both directions can remarkably be improved.

In the invention disclosed in claim 7, besides the foregoing functional effects of the invention of claim 6, since the X-direction contacted circuits and the Y-direction contacted circuits are formed by respectively connecting a plurality of rows of contacted circuits in series, the detection sensitivity of the conformation difference caused in the X-direction and the Y-direction can further be increased corresponding to the degree of the increase of the contacted circuits.

In the invention disclosed in claim 8, besides the foregoing functional effects of each invention of claim 6 and claim 7, since the contacted circuits of the X-direction contacted circuits and the Y-direction contacted circuits are made to be rectangular wavy and continuous patterns, the detection sensitivity of the conformation difference caused in the both directions can reliably be increased and at the same time the contacted circuits are made easy to be formed.

In the invention disclosed in claim 9, since the conformation difference detection circuits are composed of a plurality of rows of circuit parts-to-be-measured and channel switching circuit parts and the difference degrees of the respective object measurement circuits are respectively set in constant directions to make the electric resistance values of the respective object measurement circuits different, it is made possible to successively output at a high speed the information of the different electric resistance values of the respective circuit parts-to-be-measured, which are easily changeable when the conformation difference is caused in one constant direction. As a result, detection of the conformation difference caused in a specified constant direction can quickly be carried out.

Incidentally, by successively inputting the foregoing information of the different electric resistance values of the respective object measurement circuits by the measurement apparatus, the alteration of the different electric resistance values of the respective object measurement circuits can be identified and consequently, the conformation difference in the specified constant direction can be evaluated.

In the invention disclosed in claim 10, since the conformation difference detection circuits are composed of two difference detection circuits in the X-direction and the Y-direction and channel switching circuit parts and the difference degrees of the object measurement circuits of the respective difference detection circuits are respectively set in the X-direction or the Y-direction to make the electric resistance values of the respective object measurement circuits different, it is made possible to successively output at a high speed the information of the different electric resistance values of the respective circuit parts-to-be-measured, which are easily changeable when the conformation difference is caused in the X-direction or the Y-direction. As a result, detection of the conformation difference caused in both directions can quickly be carried out.

Incidentally, by successively inputting the foregoing information of the different electric resistance values of the respective object measurement circuits by the measurement apparatus, the alteration of the different electric resistance values of the respective object measurement circuits can be identified and consequently, the conformation difference in both direction can be evaluated.

Since the present invention is constituted and functions as described above, according to the present invention, the conformation difference detection sensitivity is improved while the direction of the conformation difference of each wiring layer of the conformation difference detection circuits being detected, and consequently, the present invention provides an excellent semiconductor device never made available before, wherein the conformation difference detection sensitivity is increased while the direction of the conformation difference of each wiring layer of the semiconductor integrated circuits being indirectly detected.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-124425 (Filed on Apr. 25, 2000) including specification, claims, drawings and summary are incorporated herein by reference in its entirety.

What is claimed is:

1. A semiconductor device, comprising:
   one or more of semiconductor integrated circuits formed on a semiconductor substrate; and
   conformation difference detection circuits formed on the same semiconductor substrate to detect a layering difference of the semiconductor integrated circuits,
   wherein said conformation difference detection circuits are so composed of a plurality of lower layer wirings formed on the semiconductor substrate, a plurality of upper layer wirings layered on the lower layer wirings via an insulating layers, through holes successively and respectively contacting the respective upper layer wirings and the lower layer wirings in prescribed directions, and electrode terminal contacting faces set in both end parts of the circuits composed of the lower layer wirings and the upper layer wirings contacted through the through holes so as to keep conformation margins with prescribed widths surrounding the contacting faces of the through holes in the respective wiring sides in the contacting faces of the through holes and the respective wirings; and
   the widths of the conformation margins are so adjusted as to be narrower in one prescribed direction than in the direction other than the prescribed direction.

2. A semiconductor device, comprising:

one or more of semiconductor integrated circuits formed on a semiconductor substrate; and conformation difference detection circuits formed on the same semiconductor substrate to detect the layering difference of the semiconductor integrated circuits, wherein the detection circuits are so composed of a plurality of lower layer wirings formed on the semiconductor substrate, a plurality of upper layer wirings layered on the lower layer wirings through insulating layers, through holes successively and respectively contacting the respective upper layer wirings and the lower layer wirings in prescribed directions, and electrode terminal contacting faces set in both end parts of the circuits composed of the lower layer wirings and the upper layer wirings contacted through the through holes so as to keep conformation margins with prescribed widths surrounding the contacting faces of the through holes in the respective wiring sides in the contacting faces of the through holes and the respective wirings;

the circuits composed of the lower wirings and the upper wirings contacted through a plurality of the through holes are made to be contacted circuits by continuing the entire circuits in certain prescribed directions in prescribed length; and the widths of the conformation margins are so adjusted as to be narrower in one prescribed direction than in the direction other than the prescribed direction.

3. The semiconductor device as set forth in claim 2, wherein the contacted circuits are formed in at least two rows and the respective contacted circuits are connected in series.

4. The semiconductor device as set forth in claim 2, wherein the contacted circuits of the lower layer wirings and the upper layer wirings are formed to be continuous and rectangular wavy patterns in one direction when observed in a plane and through holes are formed in the respective bending parts of the continuous and rectangular wavy patterns.

5. The semiconductor device as set forth in claim 2, wherein one prescribed direction is set to be the X-direction and the other direction is set to be the Y-direction.

6. A semiconductor device, comprising:

one or more of semiconductor integrated circuits formed on a semiconductor substrate; and conformation difference detection circuits formed on the same semiconductor substrate to detect the layering difference of the semiconductor integrated circuits, wherein the conformation difference detection circuits are so composed of a plurality of lower layer wirings formed on the semiconductor substrate, a plurality of upper layer wirings layered on the lower layer wirings through insulating layers, through holes successively and respectively contacting the respective upper layer wirings and the lower layer wirings in prescribed directions, and electrode terminal faces set in both end parts of the circuits composed of the lower layer wirings and the upper layer wirings contacted through the through holes as to keep conformation margins with prescribed widths surrounding the contact faces of the through holes in the respective wiring sides in the contacting faces of the through holes and the respective wirings;

the circuits composed of a plurality of the lower layer wirings and a plurality of the upper layer wirings contacted through the through hole parts are made to be two independent contacted circuits extended respectively in the X-direction and the Y-direction as a whole; and the widths of the conformation margins are so adjusted as to be narrower in the X-direction than in the Y-direction in the X-direction contacted circuits and the widths are so adjusted as to be narrower in the Y-direction than in X-direction in the Y-direction contacted circuit.

7. The semiconductor device as set forth in claim 6, wherein each of the X-direction contacted circuits and the Y-direction contacted circuits is composed of a plurality of rows of contacted circuits respectively contacted in series.

8. The semiconductor device as set forth in claim 6, wherein each of the X-direction contacted circuits and the Y-direction contacted circuits is formed to be continuous and rectangular wavy patterns in one direction when observed in a plane and through holes are formed in the respective bending parts of the continuous and rectangular wavy patterns.

9. A semiconductor device, comprising: one or more of semiconductor integrated circuits formed on a semiconductor substrate; and conformation difference detection circuits formed on the same semiconductor substrate to detect the layering difference of the semiconductor integrated circuits, wherein the conformation difference detection circuits are composed of a plurality of rows of circuit parts-to-be-measured and channel switching circuit parts for separately selecting the circuit parts-to-be-measured and contacting the selected circuit parts to a measuring apparatus in the outside;

each of the circuit parts-to-be-measured in a plurality of rows comprises a contacted circuit composed of a plurality of lower layer wirings and a plurality of upper layer wirings formed on the semiconductor substrate and through holes respectively successively contacting the terminal parts of respective upper layer wirings and the lower layer wirings in prescribed directions;

the electric resistance values of the respective circuit parts-to-be-measured are so adjusted as to be gradually increased to be higher than the electric resistance value of a specified circuit part-to-be-measured positioned in the center in both neighboring sides toward outside; and in relation to the electric resistance values of the respective circuit parts-to-be-measured positioned at object positions in both sides of the foregoing specified circuit part-to-be-measured in the center, the positioning difference of the through holes from the lower layer wirings and the upper layer wirings of circuit parts-to-be-measured positioned in one side is so set as to be a specified value obtained by keeping the positioning difference all over to a prescribed extent in one direction along the extension direction of circuit parts-to-be-measured; and at the same time the positioning difference of the through holes from the lower layer wirings and the upper layer wirings of circuit parts-to-be-measured positioned in the other side is so set as to be a specified value obtained by keeping the positioning difference all over to a prescribed extent, which is same as that of the circuit parts-to-be-measured positioned in the foregoing one side, in one direction along the extension direction of circuit parts-to-be-measured.

10. A semiconductor device, comprising:

one or more of semiconductor integrated circuits formed on a semiconductor substrate; and conformation difference detection circuits formed on the same semiconductor substrate to detect the layering difference of the semiconductor integrated circuits, wherein the conformation difference detection circuits are composed of two detection circuits separately formed in the X-direction and the Y-direction, respectively and each difference detection circuit in the X-direction and the Y-direction is composed of a plurality of rows of circuit parts-to-be-measured and channel switching circuit parts for separately selecting the circuit parts-to-be-measured and contacting the selected circuit parts to a measuring apparatus in the outside;

each of the circuit parts-to-be-measured in a plurality of rows comprises a contacted circuit composed of a plurality of lower layer wirings and a plurality of upper layer wirings formed on the semiconductor substrate and through holes respectively successively contacting the terminal parts of respective upper layer wirings and the lower layer wirings in prescribed directions;

the electric resistance values of the respective circuit parts-to-be-measured are so adjusted as to be gradually increased to be higher values than the electric resistance value of a specified circuit part-to-be-measured positioned in the center in both neighboring sides toward outside; and in relation to the electric resistance values of the respective circuit parts-to-be-measured positioned at object positions in both sides of the foregoing specified circuit part-to-be-measured, the positioning difference of the through holes from the lower layer wirings and the upper layer wirings of circuit parts-to-be-measured positioned in one side is so set as to be a specified value obtained by keeping the positioning difference all over to a prescribed extent in one direction along the extension direction of circuit parts-to-be-measured; and at the same time the positioning difference of the through holes from the lower layer wirings and the upper layer wirings of circuit parts-to-be-measured positioned in the other side is so set as to be a specified value obtained by keeping the positioning difference all over to a prescribed extent, which is same as that of the circuit parts-to-be-measured positioned in the foregoing one side, in one direction along the extension direction of circuit parts-to-be-measured.

* * * * *